(12) United States Patent
Mimura et al.

(10) Patent No.: US 7,316,959 B2
(45) Date of Patent: Jan. 8, 2008

(54) SEMICONDUCTOR DEVICE AND METHOD FOR FABRICATING THE SAME

(75) Inventors: Takashi Mimura, Kawasaki (JP); Keiji Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 222 days.

(21) Appl. No.: 11/004,836

(22) Filed: Dec. 7, 2004

(65) Prior Publication Data

US 2005/0085027 A1    Apr. 21, 2005

Related U.S. Application Data

(62) Division of application No. 10/382,855, filed on Mar. 7, 2003, now Pat. No. 6,855,987.

(30) Foreign Application Priority Data

Mar. 8, 2002    (JP) .............................. 2002-63370

(51) Int. Cl.
*H01L 21/00* (2006.01)
(52) U.S. Cl. ...................... 438/297; 438/299; 438/300
(58) Field of Classification Search ................ 438/297, 438/299, 300
See application file for complete search history.

(56) References Cited

U.S. PATENT DOCUMENTS

| 5,841,171 | A | * | 11/1998 | Iwamatsu et al. ............ 257/347 |
| 6,180,985 | B1 | | 1/2001 | Yeo .............................. 257/354 |
| 6,281,054 | B1 | | 8/2001 | Yeo ............................. 438/149 |
| 6,469,350 | B1 | | 10/2002 | Clark, Jr. et al. ............ 257/349 |
| 6,538,916 | B2 | | 3/2003 | Ohsawa ....................... 365/149 |
| 6,586,284 | B2 | | 7/2003 | Kim ............................ 438/149 |
| 6,627,511 | B1 | * | 9/2003 | Racanelli et al. ........... 438/404 |

FOREIGN PATENT DOCUMENTS

| JP | 06350085 A | 12/1994 |
| JP | 07335898 A | 12/1995 |
| JP | 8-316335 A | 11/1996 |
| JP | 09082944 A | 3/1997 |
| JP | 09219524 A | 8/1997 |
| JP | 09321307 A | 12/1997 |
| JP | 11274497 A | 10/1999 |
| JP | 2001160594 A | 6/2001 |
| JP | 2001291864 A | 10/2001 |

OTHER PUBLICATIONS

Ken Uchida et al., "The Division of the Japan Society of Applied Physics", Silicon Technology, No. 35, pp. 88-93, Jan. 22, 2002.
Japanese Office Action in Application No. 2002-063370 dated Nov. 7, 2006.

* cited by examiner

*Primary Examiner*—Laura M. Schillinger
(74) *Attorney, Agent, or Firm*—Westerman, Hattori, Daniels & Adrian, LLP.

(57) ABSTRACT

The semiconductor device comprises a semiconductor layer 18 formed on an insulation layer 16, a gate electrode 22 formed on the semiconductor layer with a gate insulation film 20 formed therebetween, a source/drain region 24 formed on the semiconductor layer on both sides of the gate electrode, and a semiconductor region 14 buried in the insulation layer 16 in a region below the gate electrode. The surface scattering of the carriers and phonon scattering can be prevented while suppressing the short channel effect. Resultantly the semiconductor device can have high mobility and high speed.

5 Claims, 27 Drawing Sheets

SEMICONDUCTOR DEVICE AND METHOD FOR FABRICATING THE SAME

CROSS-REFERENCE TO RELATED APPLICATION

This application is a division of U.S. application Ser. No. 10/382,855, filed on Mar. 7, 2003 now U.S. Pat. No. 6,855,987 which is based upon and claims priority of Japanese Patent Application No. 2002-63370, filed on Mar. 8, 2002, the contents being incorporated herein by reference.

BACKGROUND OF THE INVENTION

The present invention relates to a semiconductor device and a method for fabricating the semiconductor device, more specifically a semiconductor device which can increase the carrier mobility while suppressing the short channel effect, and a method for fabricating the semiconductor device.

Recently, to realize high speed and micronization of MOSFETs it is noted to use SOI (Silicon On Insulator) substrates.

A proposed semiconductor device using an SOI substrate will be explained with reference to FIG. 27. FIG. 27 is a sectional view of the proposed semiconductor device.

As shown in FIG. 27, a semiconductor layer of Si is formed on a substrate 110 of Si with an insulation film 112 formed therebetween. The substrate 110 is a base substrate for the SOI substrate 108. The insulation layer 112 is a buried oxide film of the SOI substrate 108. The semiconductor layer 114 is an Si layer formed on the buried oxide film of the SOI substrate 108. A gate electrode 122 is formed on the semiconductor layer 114 with the gate insulation film 120 formed therebetween. A source/drain diffused layer 124 is formed in the semiconductor layer 114 on both sides of the gate electrode 122.

In the proposed semiconductor device using the SOI substrate, because of the insulation film 112 formed between the lower surface of the source/drain diffused layer 124 and the silicon substrate 110, a parasitic capacitance between the source/drain diffused layer 124 and the silicon substrate 110 can be small. The SOI substrate permits the source/drain diffused layer to be formed by shallow junction.

Then, recently, the semiconductor device is increasingly micronized. As the semiconductor devices are more micronized, the semiconductor layer 114 is increasingly thinned so as to prevent the short channel effect.

However, as the semiconductor layer 114 is increasingly thinned, the carrier surface scattering and the phonon scattering are increased in the interface between the semiconductor layer 114 and the buried diffused layer 112, which lower a carrier mobility (Reference: The division of the Japan Society of Applied Physics, Silicon Technology, No. 35, 22th Jan. 2002, pp. 88-93). The decrease of the carrier mobility has been a barrier to higher speed of the semiconductor device.

SUMMARY OF THE INVENTION

An object of the present invention is to provide a semiconductor device which can increase the carrier mobility while suppressing the short channel effect, and a method for fabricating the semiconductor device.

According to one aspect of the present invention, there is provided a semiconductor device comprising: a semiconductor layer formed on an insulation layer; a gate electrode formed on the semiconductor layer with a gate insulation film formed therebetween; a source/drain region formed in the semiconductor layer on both sides of the gate electrode; and a semiconductor region buried in the insulation layer in a region below the gate electrode.

According to another aspect of the present invention, there is provided a method for fabricating a semiconductor device comprising the steps of: forming a mask on a first semiconductor layer formed on a substrate; oxidizing the first semiconductor layer on both sides of the mask to thereby form the first semiconductor layer outside the mask into an insulation film; forming a second semiconductor layer on the first semiconductor layer and the insulation layer; forming a gate insulation film on the second semiconductor layer on the second semiconductor layer; forming a gate electrode on the gate insulation film; and forming a source/drain region in the second semiconductor layer on both sides of the gate electrode.

The present invention can prevent the surface scattering of carriers and the phonon scattering while suppressing the short channel effect. Thus, the present invention can provide a semiconductor device having high mobility and high speed.

DETAILED DESCRIPTION OF THE INVENTION

A FIRST EMBODIMENT

Figure 1:
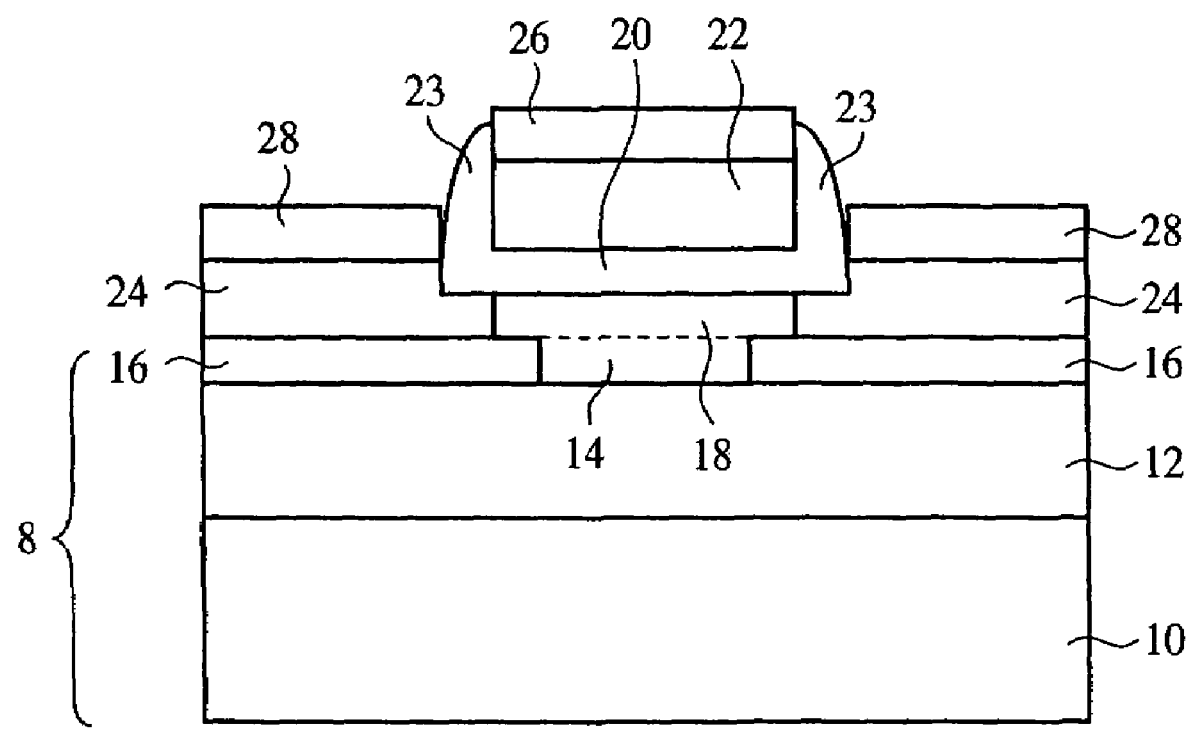
FIG. 1 is a sectional view of the semiconductor device according to a first embodiment of the present invention.

The semiconductor device according to a first embodiment of the present invention and a method for fabricating the semiconductor device will be explained with reference to FIGS. 1 to 5C. FIG. 1 is a sectional view of the semiconductor device according to the present embodiment.

(The Semiconductor Device)

First, the semiconductor device according to the present embodiment will be explained with reference to FIG. 1.

As shown in FIG. 1, an insulation film 12 of, e.g., 100 nm-thickness $SiO_2$ is formed on a substrate 10 of silicon.

On the insulation film 12, a semiconductor region 14 of, e.g., a 20 nm-thickness p type Si. The semiconductor region 14 is single crystallized.

An insulation film 16 of $SiO_2$ is formed on both sides of the semiconductor region 14. The insulation layer 16 is formed by oxidizing a semiconductor layer.

In the present embodiment, an SOI substrate 8 is used. The substrate 10 is the base substrate of the SOI substrate 8. The insulation layer 12 is a buried oxide film (BOX, Buried OXide) of the SOI substrate 8. The semiconductor region 14 is a part of an Si layer formed on the buried oxide film of the SOI substrate 8.

A 10 nm-thickness semiconductor layer 18 of intrinsic Si is formed on the semiconductor region 14 and the insulation layer 16. The semiconductor layer 18 is epitaxially grown on the semiconductor region 14.

A gate electrode 22 of polysilicon is formed on the semiconductor layer 18 with a gate insulation film 20 of, e.g., below 2 nm-thickness $SiO_2$ therebetween.

A sidewall insulation film 23 of, e.g., $SiO_2$ is formed on the side wall of the gate electrode 22.

A source/drain region 24 of Pt silicide is formed on the semiconductor layer 18 on both sides of the gate electrode 22.

In the present embodiment, the source/drain region 24 is formed of Pt silicide but is not essentially formed of Pt silicide. The source/drain region 24 may be formed of, e.g., Er silicide, Ti silicide, W silicide, Co silicide, Ni silicide, Gd silicide, Pd silicide or others, or silicides of other metals.

A metal silicide film 26 of Pt silicide is formed on the gate electrode 22.

Source/drain electrodes 28 are formed respectively on the source/drain region 24.

Thus, the semiconductor device according to the present embodiment is constituted.

The semiconductor device according to the present embodiment is characterized mainly in that the semiconductor region 14 is formed below the semiconductor layer 18, and the insulation layer 16 is formed below the source/drain region 24, i.e., on both sides of the semiconductor region 14.

Figure 22A:
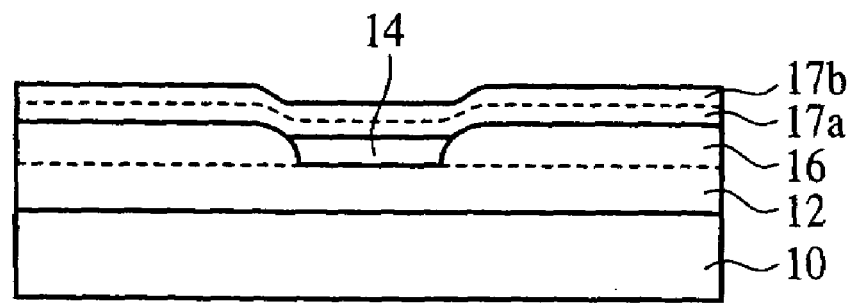
FIGS. 22A to 22C are sectional views of the semiconductor device according to the third embodiment of the present invention in the steps of the method for fabricating the semiconductor device, which show the method (Part 1).
Figure 22B:
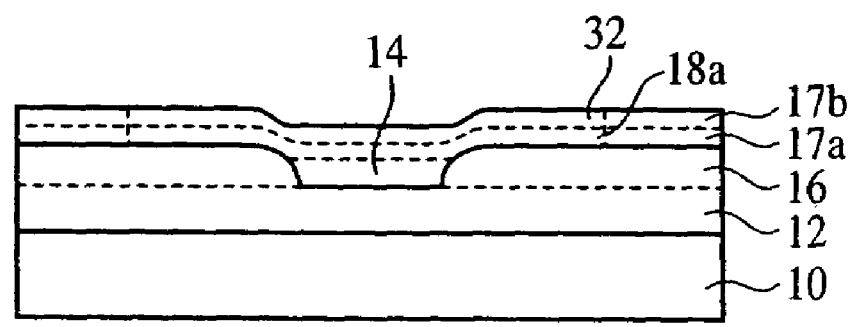
Figure 22C:
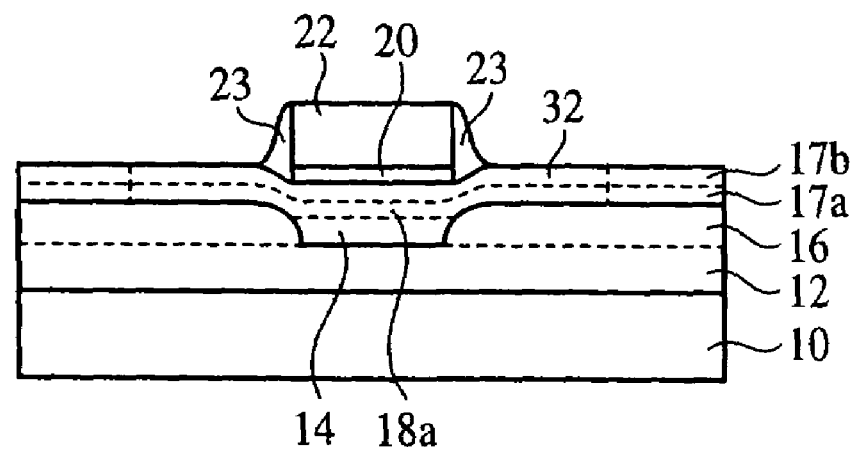
Figure 23A:
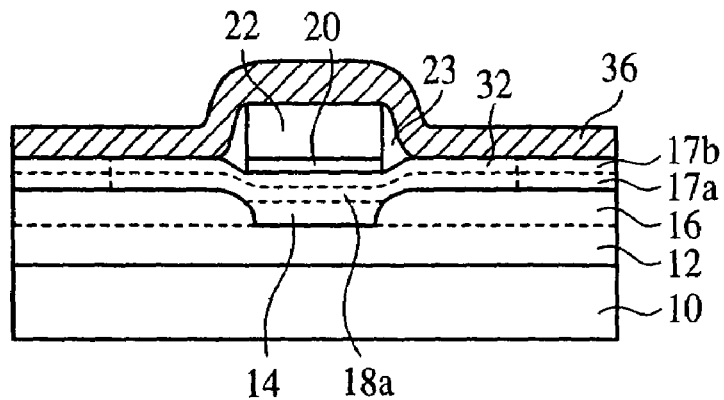
FIGS. 23A to 23C are sectional views of the semiconductor device according to the third embodiment of the present invention in the steps of the method for fabricating the semiconductor device, which show the method (Part 2).
Figure 23B:
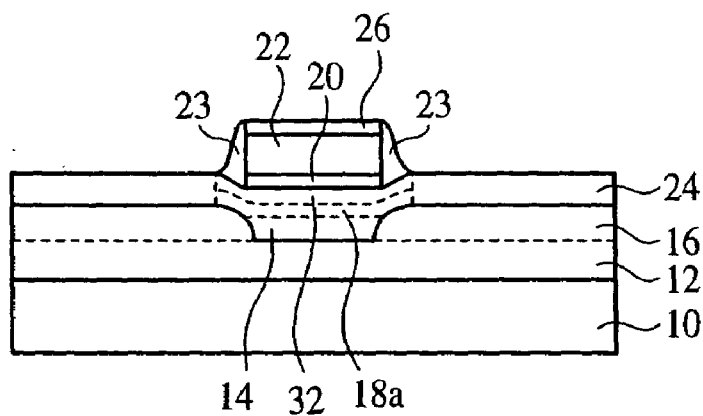
Figure 23C:
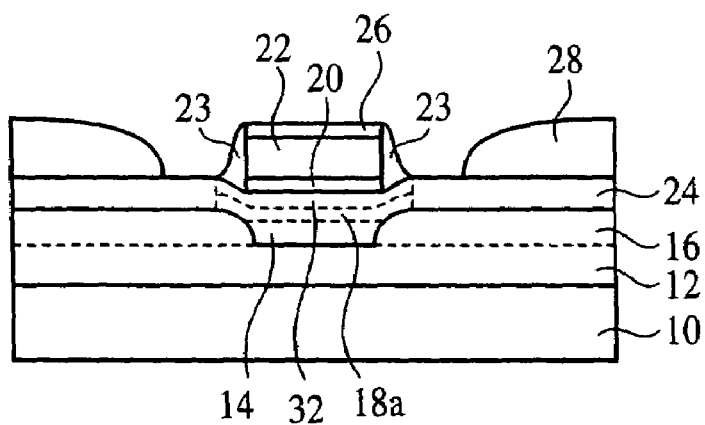

In the proposed semiconductor device shown in FIGS. 22A to 22C, the semiconductor layer 114 is simply thinned for the prevention of the short channel effect, which causes surface scattering of the carriers and phonon scattering in the interface between the semiconductor layer 114 and the buried oxide film 112. Accordingly, the proposed semiconductor device have low mobility and has failed to increase speed.

Figure 2:
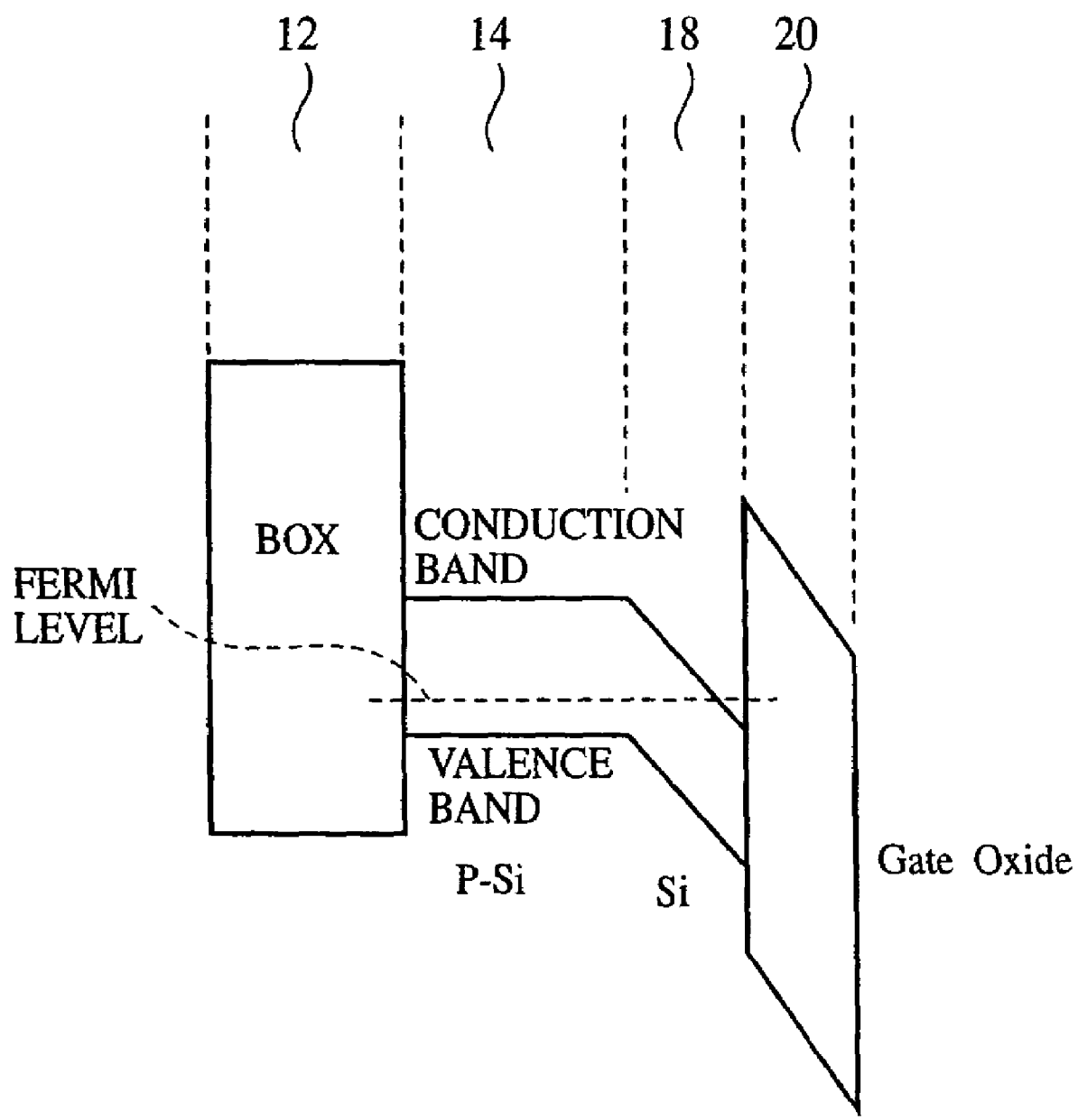
FIG. 2 is a view of an energy band structure of the semiconductor device according to the first embodiment of the present invention.

In contrast to this, according to the present embodiment, because of the semiconductor region 14 formed below the semiconductor layer 18, the energy band structure shown in FIG. 2 can be obtained. FIG. 2 is a view of the energy band structure of the semiconductor device according to the present embodiment.

As shown in FIG. 2, a peak of the potential barrier to the carriers is near the border between the semiconductor region 14 and the semiconductor layer 18. Accordingly, in the present embodiment, the carriers can be confined in the semiconductor layer 18. According to the present embodiment, the carriers can be confined in a region spaced from the surface of the buried oxide film 12, whereby the surface scattering of the carriers and phonon scattering in the surface of the buried oxide film 12 can be prevented.

Furthermore, according to the present embodiment, the insulation film 16 is formed below the source/drain region 24, i.e., on both sides of the semiconductor region 14, where by radial extension of electric fields from the source/drain region 24 can be prevented. Thus, according to the present embodiment, the short channel effect can be prevented.

As described above, according to the present embodiment, the surface scattering of the carriers and phonon scattering can be prevented while suppressing the short channel effect. Resultantly the semiconductor device can have high mobility and high speed.

The semiconductor device according to the present embodiment is called a channel barrier (CB) MOSFET for confining the carriers in the semiconductor layer 18 by the potential barrier.

(The Method for Fabricating the Semiconductor Device)

Then, the method for fabricating the semiconductor device according to the present embodiment will be explained with reference to FIGS. 3A to 5C. FIGS. 3A to 5C are sectional views of the semiconductor device according to the present embodiment in the steps of the method for fabricating the semiconductor device, which show the method.

Figure 3A:
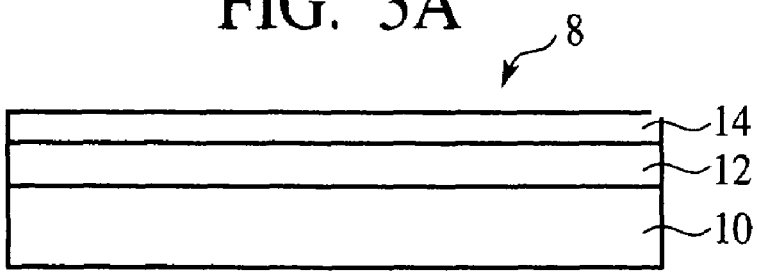
FIGS. 3A to 3D are sectional views of the semiconductor device according to the first embodiment of the present invention in the steps of the method for fabricating the semiconductor device, which show the method (Part 1).

First, as shown in FIG. 3A, the SOI substrate 8 is prepared. To be specific, the SOI substrate 8 comprising, for example, the buried oxide film 12 of $SiO_2$ buried in the silicon substrate 10, and the Si layer 14 of, e.g., a 20 nm-thickness formed on the buried oxide film 12 is used.

Figure 3B:
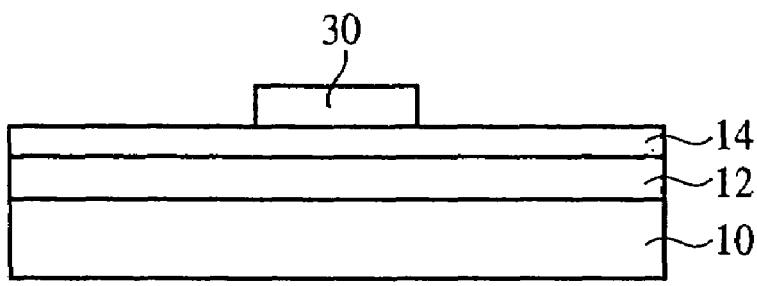

Then, an SiN film is formed on the entire surface by, e.g., sputtering. Then, the SiN film is patterned by photolithography. Thus, as shown in FIG. 3B, a hard mask 30 of SiN is formed.

Figure 3C:
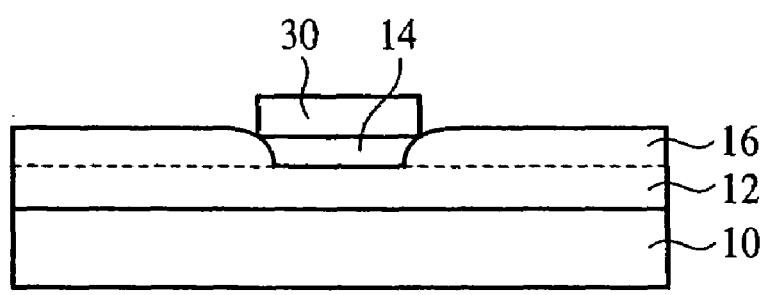

Then, as shown in FIG. 3C, with the hard mask 30 as a mask, that of the semiconductor layer 14, which is exposed outside the hardmask 30 is oxidized by, e.g., thermal oxidation. Thus, the part of the semiconductor layer 14 exposed outside the hard mask 30 becomes the insulation layer 16 of $SiO_2$. Thus, the semiconductor region 14 is buried in the insulation layer 16.

Figure 3D:
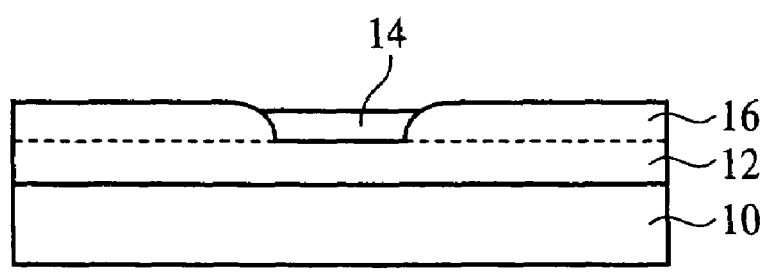

Next, as shown in FIG. 3D, the hard mask 30 is removed by wet etching.

Then, boron, a p type dopant is implanted in the semiconductor region 14 by ion implantation. Thus, the semiconductor region 14 has p type conduction.

Figure 4A:
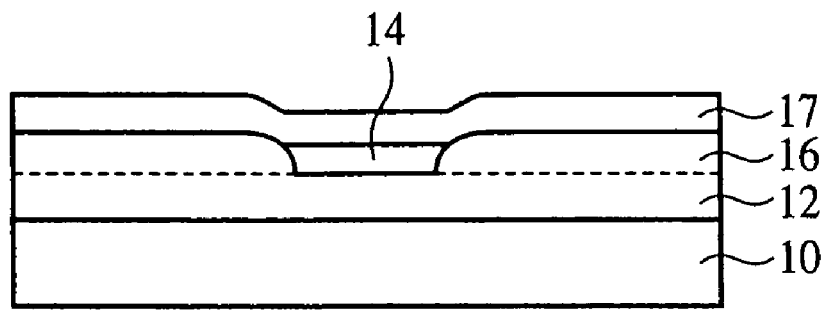
FIGS. 4A to 4C are sectional views of the semiconductor device according to the first embodiment of the present invention in the steps of the method for fabricating the semiconductor device, which show the method (Part 2).

Next, as shown in FIG. 4A, an amorphous silicon film 17 of, e.g., a 10 nm-thickness is formed on the entire surface by, e.g., CVD (Chemical Vapor Deposition). A raw material gas is, e.g, $SiH_4$. A film forming temperature is, e.g., about 450° C.

Figure 4B:
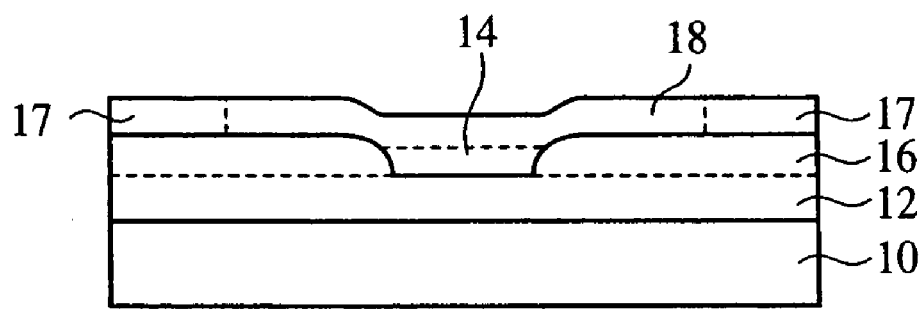
Figure 4C:
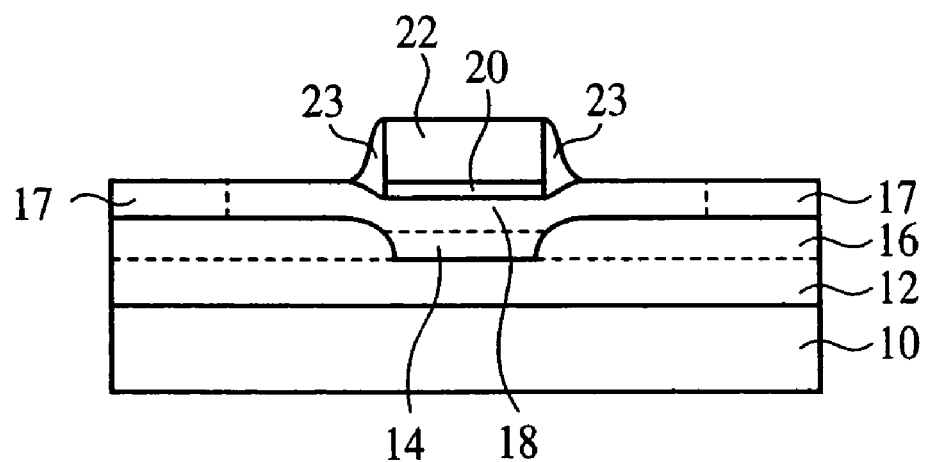

Then, as shown in FIG. 4B, the amorphous silicon film 17 is single crystallized by solid phase epitaxial (SPE) growth or excimer laser annealing (ELA) or others. Thermal processing conditions are, e.g., 550° C. and for 12 hours. Thus, the single crystal grows from the center of the semiconductor region 14 to both sides by, e.g., about 0.2-0.3 μm. The gate length is, e.g., about 0.1 μm, and such growth of the single crystal is sufficient. Thus, the single crystallized semiconductor layer 18 is formed.

Then, the gate insulation film 20 of an $SiO_2$ film of, e.g., 2 nm-thickness on the entire surface by thermal oxidation.

Next, a polysilicon film of, e.g., a 180 nm-thickness is formed on the entire surface by CVD. Then, the polysilicon film is patterned by photolithography. Thus, the gate electrode 22 of polysilicon is formed.

Next, an $SiO_2$ film of, e.g., a 150 nm-thickness is formed on the entire surface by, e.g., CVD. Next, the $SiO_2$ film is anisotropically etched to thereby form the sidewall insulation film 23 of $SiO_2$ on the side wall of the gate electrode 22 (see FIG. 4C).

Figure 5A:
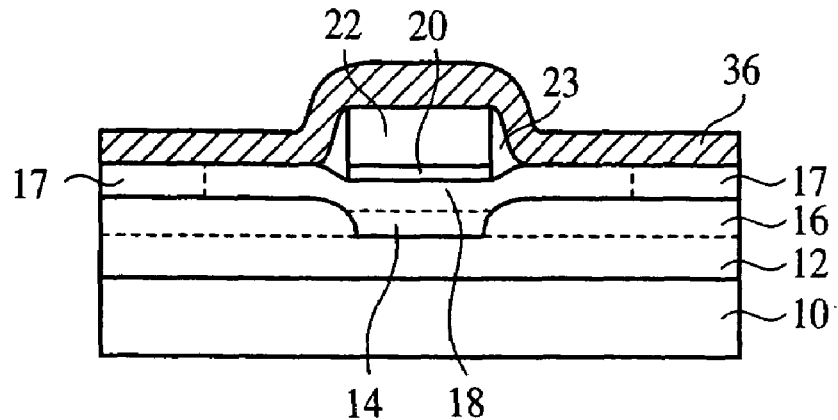
FIGS. 5A to 5C are sectional views of the semiconductor device according to the first embodiment of the present invention in the steps of the method for fabricating the semiconductor device, which show the method (Part 3).
Figure 5B:
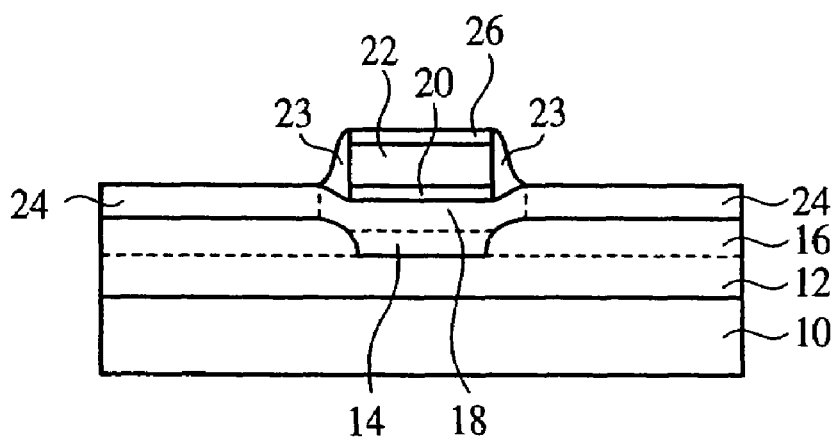

Then, as shown in FIG. 5A, a metal film 36 of Pt is formed on the entire surface.

Then, the semiconductor layer 18 on both sides of the gate electrode 20 is silicided by thermal processing. Thus, the source/drain region 24 of Pt silicide is formed. Then, the unreacted metal film 36 is etched. Thus, the source/drain region 24 of Pt silicide is formed on the semiconductor layer 18 on both sides of the gate electrode 22 (see FIG. 5B). The metal silicide film 26 of Pt silicide is formed on the gate electrode 22. Since the source/drain region 24 is formed of a metal silicide, an ion implanting step for forming the source/drain diffused layer is unnecessary. Thus, the fabrication steps can be simplified, which contributes lower costs.

Figure 5C:
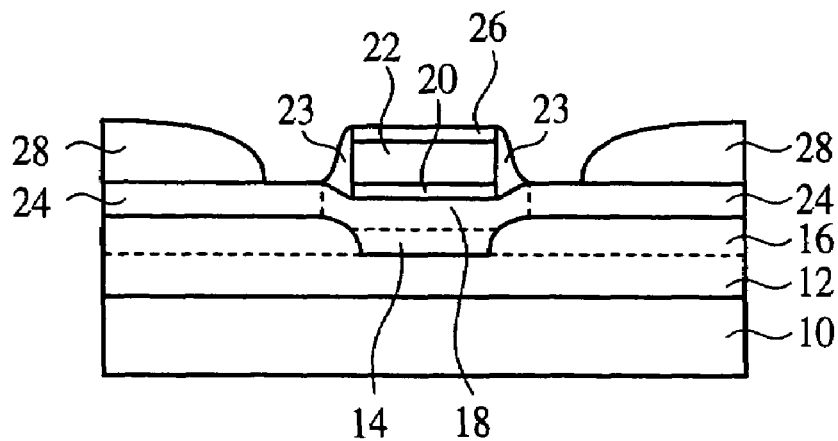

Then, as shown in FIG. 5C, the source/drain electrode 28 is formed on the source/drain region 24.

Thus, the semiconductor device according tot he present embodiment is fabricated.

(Modification 1)

Figure 6:
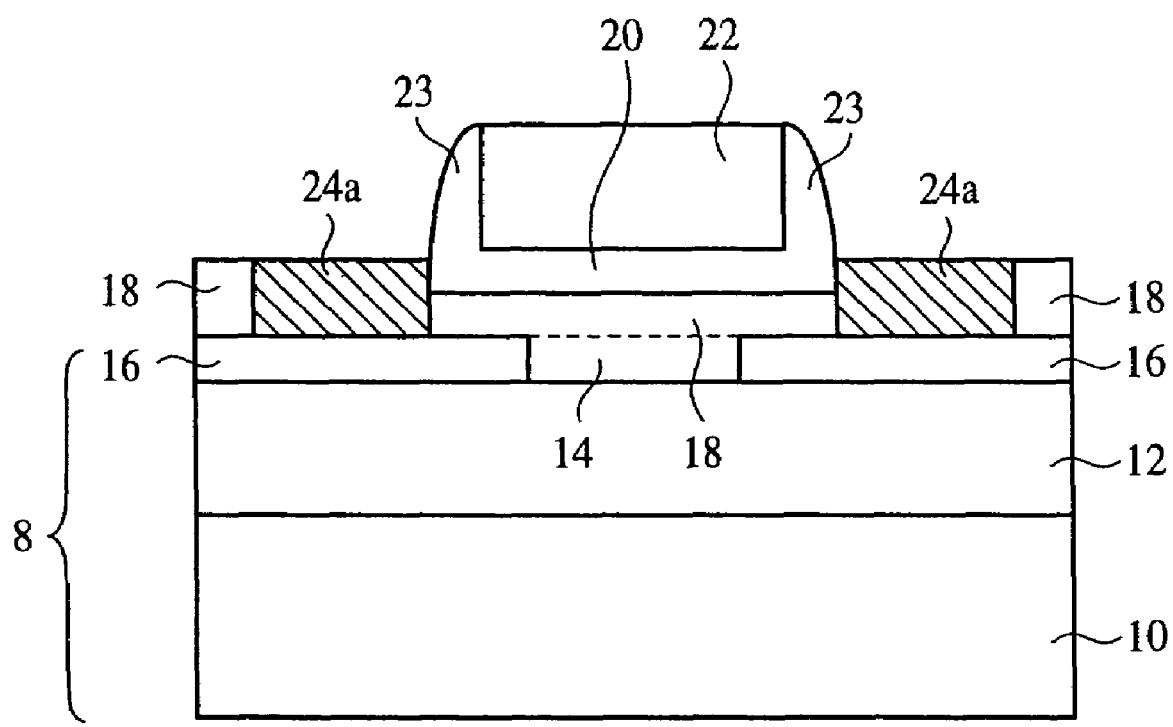
FIG. 6 is a sectional view of the semiconductor device according to Modification 1 of the first embodiment of the present invention.

Modification 1 of the semiconductor device according to the present embodiment will be explained with reference to FIG. 6. FIG. 6 is a sectional view of the semiconductor device according to the present Modification.

The semiconductor device according to the present embodiment is characterized mainly in that a source/drain region 24a of a metal is buried in a semiconductor layer 18 on both sides of a gate electrode 22.

As shown in FIG. 6, the source/drain region 24a of, e.g., Pt is buried in the semiconductor layer 18 on both sides of the gate electrode 22.

In the present modification, the source/drain region 24a is formed of Pt but is not essentially formed of Pt. The source/drain region 24a may be formed of, e.g., Er, Ti, W, Co, Ni, Gd, Pd or other metals.

Thus, the semiconductor device according to the present modification is constituted.

Next, the method for fabricating the semiconductor device according to the present modification will be explained with reference to FIGS. 7A to 7D. FIGS. 7A to 7D are sectional views of the semiconductor device according to the present modification in the steps of the method for fabricating the semiconductor device, which show the method.

First, the steps up to the step of forming the sidewall insulation film 23 including the sidewall insulation film step are the same as those of the method for fabricating the semiconductor device shown in FIGS. 3A to 4C, and their explanation will not be repeated.

Next, a resist film 38 is formed on the entire surface. Next, openings 40 are formed in the resist film 38 down to the conductor layer 18 by photolithography (see FIG. 7A).

Figure 7A:
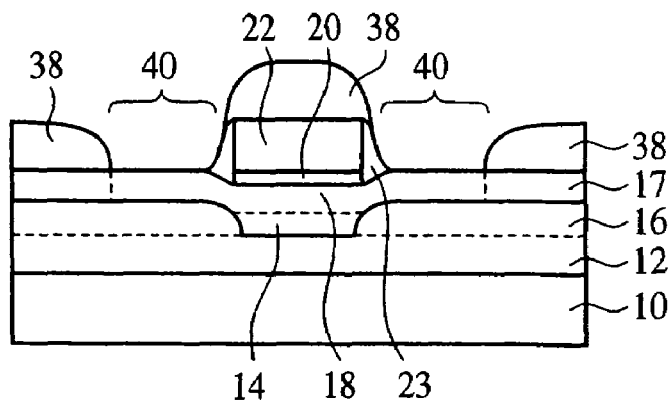
FIGS. 7A to 7D are sectional views of the semiconductor device according to Modification 1 of the first embodiment of the present invention in the steps of the method for fabricating the semiconductor device, which show the method.
Figure 7B:
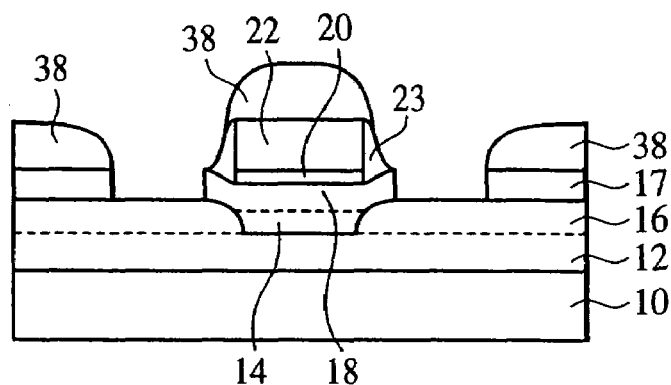

Then, as shown in FIG. 7B, with the resist film 38 as a mask, the semiconductor layer 18 is etched.

Figure 7C:
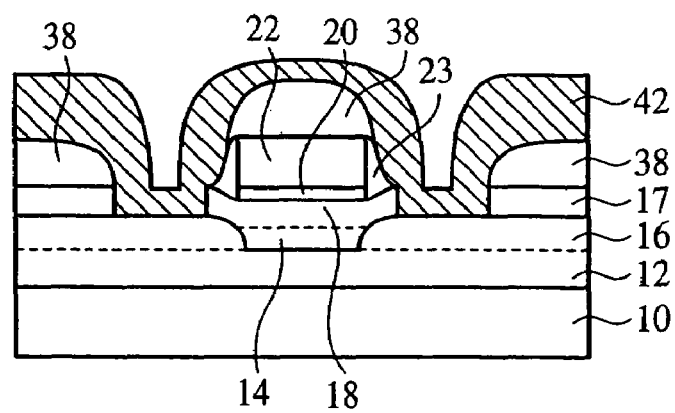

Next, as shown in FIG. 7C, the metal film 42 of, e.g., Pt is formed on the entire surface.

Figure 7D:
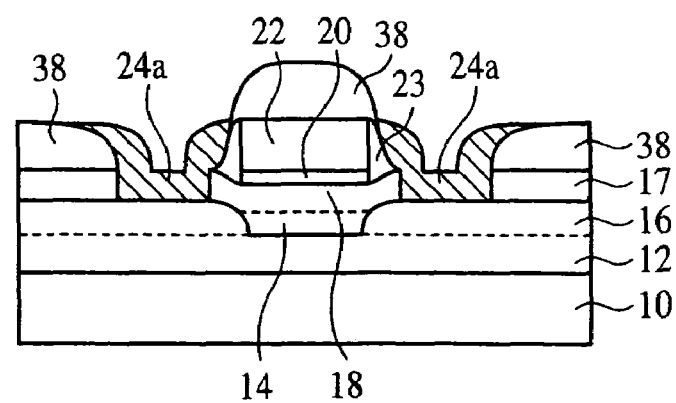

Then, as shown in FIG. 7D, the metal film 42 except that in the source/drain region 24a is etched to thereby the source/drain region 24a of the metal buried in the semiconductor layer 18 on both sides of the gate electrode 22. Then, the resist film 238 is removed.

Thus, the semiconductor device according to the present modification is fabricated.

(Modification 2)

Figure 8:
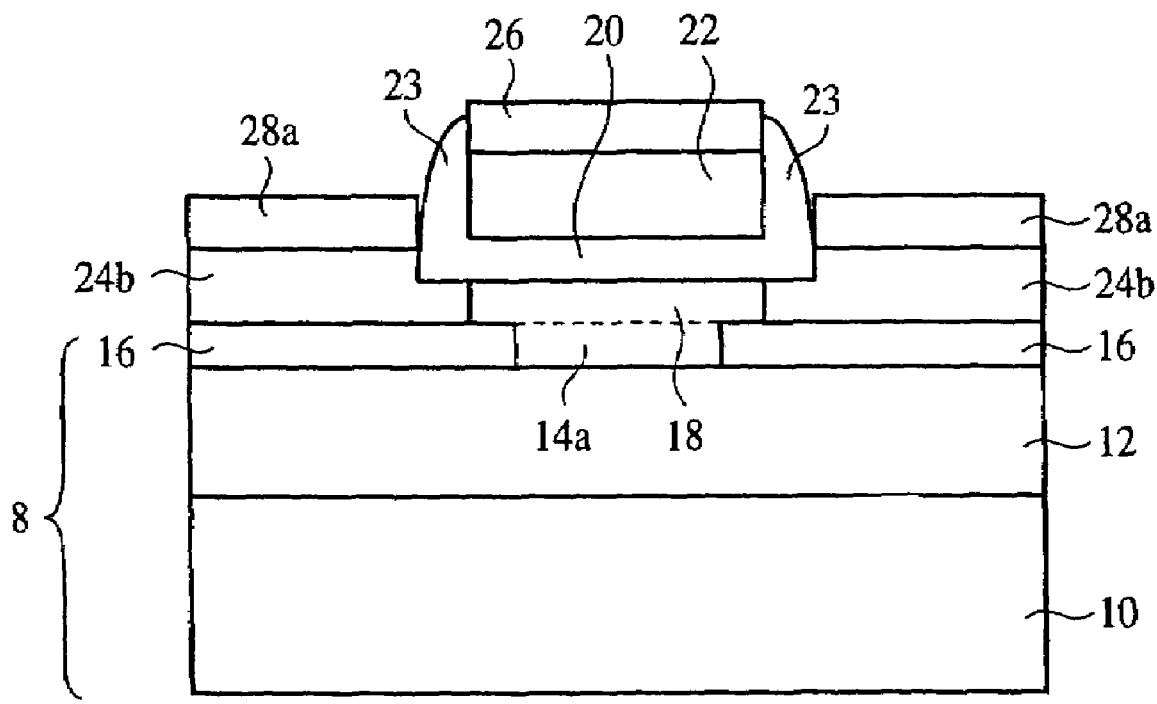
FIG. 8 is a sectional view of the semiconductor device according to Modification 2 of the first embodiment of the present invention.

Next, Modification 2 of the semiconductor device according to the present embodiment will be explained with reference to FIG. 8. FIG. 8 is a sectional view of the semiconductor device according to the present modification.

The semiconductor device according to the present modification is characterized mainly in that a dopant is implanted in the semiconductor layer 18 on both sides of the gate electrode 22 by ion implantation to form the source/drain diffused layer 24b.

As shown in FIG. 8, in the semiconductor device according to the present embodiment, the source/drain diffused layer 24b is formed on the semiconductor device 18 on both sides of the gate electrode 22.

Metal silicide films 26, 28a are formed respectively on the gate electrode 22 and the source/drain diffused layer 24b.

Thus, the semiconductor device according to the present modification is constituted.

Figure 9:
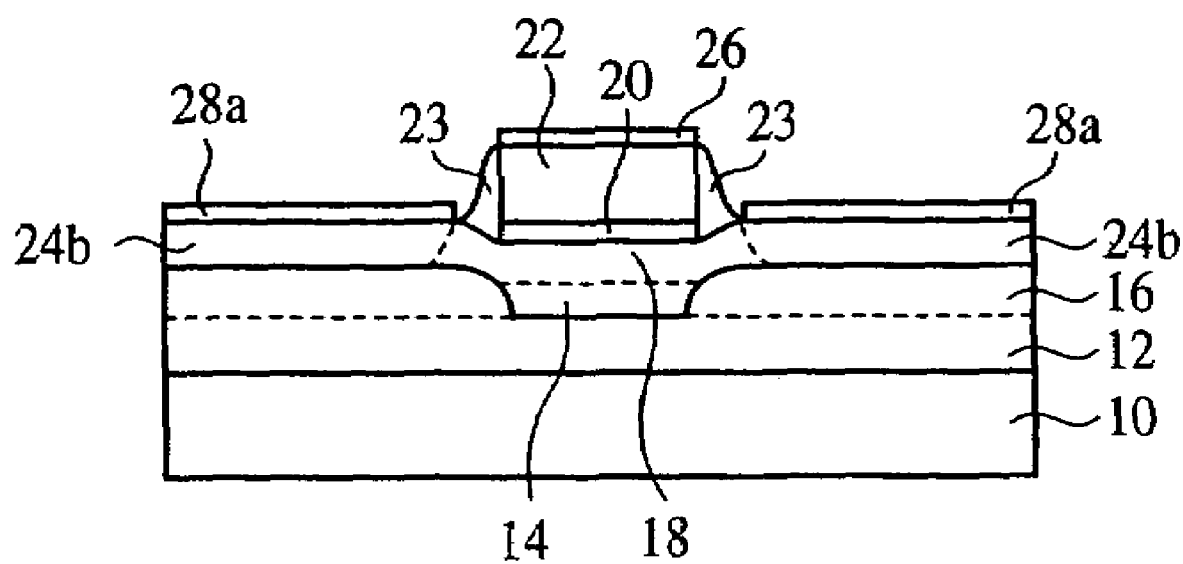
FIG. 9 is sectional views of the semiconductor device according to Modification 2 of the first embodiment of the present invention in the steps of the method for fabricating the semiconductor device, which show the method.

Then, the method for fabricating the semiconductor device according to the present modification will be explained with reference to FIG. 9. FIG. 9 is sectional views of the semiconductor device according to the modification in the steps of fabricating the semiconductor device, which show the method.

First, the steps up to the step of forming the sidewall insulation film 23 including the sidewall insulation film forming step are the same as those of the method for fabricating the semiconductor device shown in FIGS. 3A to 4C, and their explanation will not be repeated.

Then, a dopant is implanted in the semiconductor layer 18 by, e.g., ion implantation by self alignment with the gate electrode 22 with the sidewall insulation film 23 formed on. The source/drain diffused layer 24b is also formed on both sides of the gate electrode 22.

Then, a metal silicide film 28 is formed on the gate electrode 22 and the source/drain diffused layer 24b over the entire surface by SALICIDE (Self-Aligned Silicide) process.

That is, first, a metal film of, Ti, Co or Ni is deposited on the entire surface by, e.g., vapor deposition. Then, acetal silicide film is formed on the expose gate electrode 22 and the source/drain diffused layer 24b by self-alignment at low temperature by RTA (Rapid Thermal Anneal). Then, the unreacted metal film is etched by wet etching, RIE (Reactive Ion Etching) or ion milling. Then, thermal processing is performed by RTA to improve the film quality of the metal silicide film. Thus, the metal silicide film 26, 28a are formed respectively on the gate electrode 22 and the source/drain region 24b by SALICIDE process (see FIG. 9).

Thus, the semiconductor device according to the present modification is fabricated.

(Modification 3)

Figure 10:
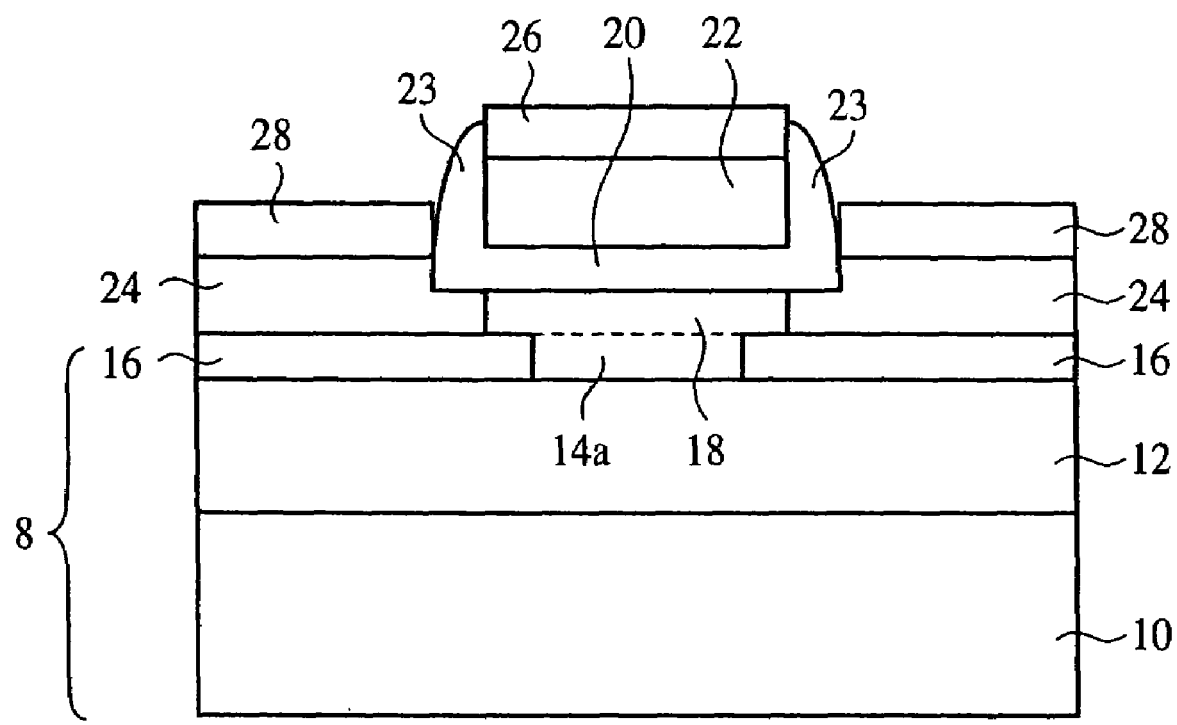
FIG. 10 is a sectional view of the semiconductor device according to Modification 3 of the first embodiment of the present invention.

Next, Modification 3 of the semiconductor device according to the present embodiment will be explained with reference to FIG. 10. FIG. 10 is a sectional view of the semiconductor device according to the present modification.

The semiconductor device according to the present modification is characterized mainly in that a semiconductor region 14a of intrinsic Si is formed below a semiconductor layer 18 of intrinsic Si.

In the semiconductor device shown in FIG. 1, the semiconductor region 14 of p type Si is formed below the semiconductor layer 18 of intrinsic Si, whereby the energy band structure shown in FIG. 2 can be obtained, and the carriers are confined in the semiconductor layer 18.

Figure 11:
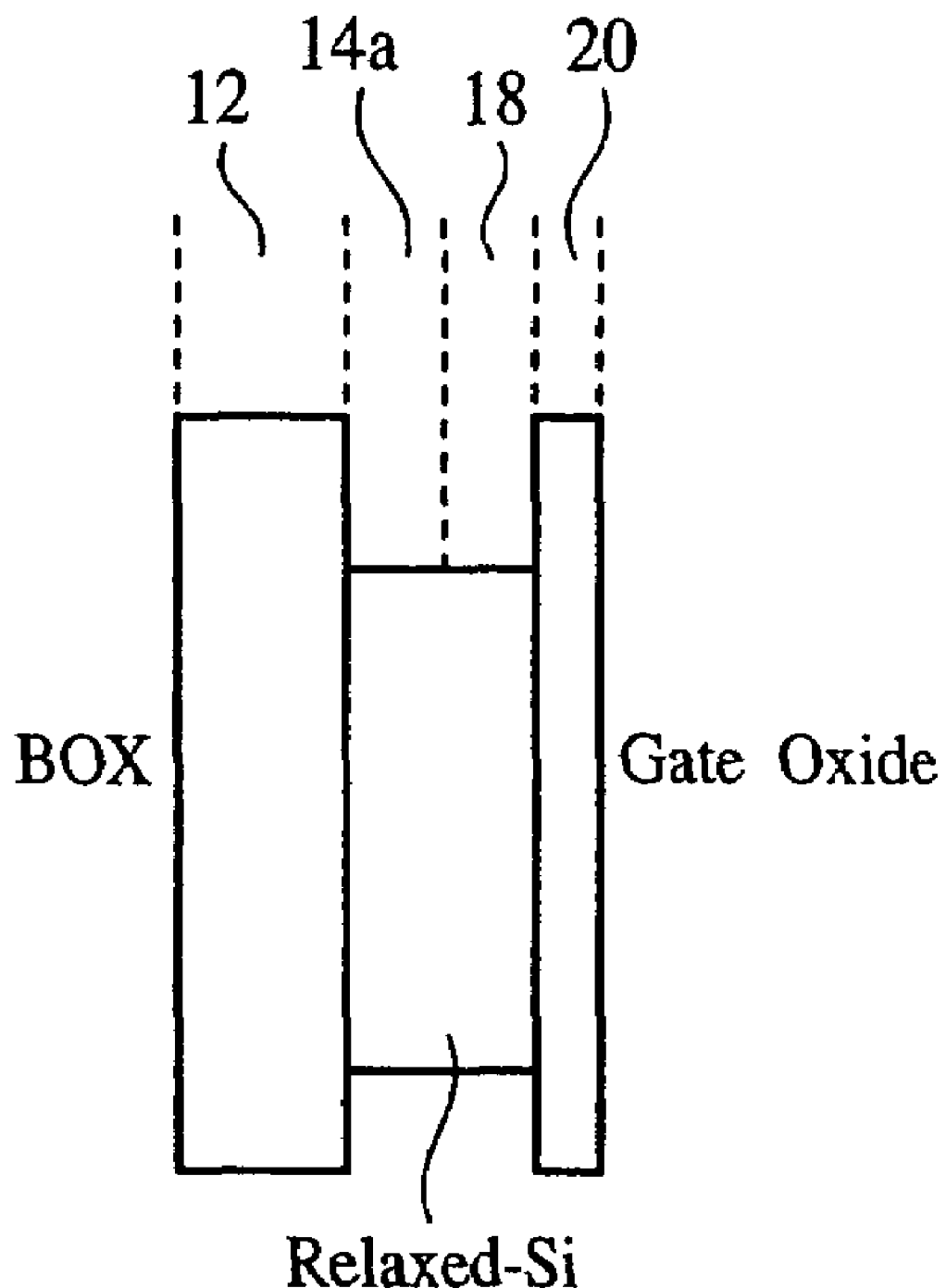
FIG. 11 is a view of an energy band structure of the semiconductor device of Modification 3 of the first embodiment of the present invention.

In the present modification, the semiconductor region 14a of intrinsic Si is formed below the semiconductor layer 18 of intrinsic Si, whereby the energy band structure shown in FIG. 11 can be obtained. FIG. 11 is a view of an energy band structure of the semiconductor device according to the present modification. That is, in the present modification, the carriers cannot be confined only in the semiconductor layer 18, as are in the semiconductor device shown in FIG. 1.

However, in the present modification, the semiconductor region 14a of intrinsic Si is formed below the semiconductor layer 18 of intrinsic Si, whereby a total film thickness of the semiconductor layers below the gate electrode 22 is larger than that of the semiconductor layer 18 alone forming the channel layer. That is, in the present modification, the surface scattering of the carriers and the phonon scattering can be depressed almost as much as in a semiconductor device having the channel layer formed of a thick semiconductor layer.

Furthermore, generally the short channel effect tends to occur in a semiconductor device having the channel layer formed of a thick semiconductor layer. However, in the present modification, because of the insulation layer 16 formed on both sides of the semiconductor region 14a, i.e., below the source/drain region 24, the short channel effect can be suppressed.

Accordingly, the semiconductor device according to the present modification can have high mobility and high speed while suppressing the short channel effect.

(Modification 4)

Figure 12:
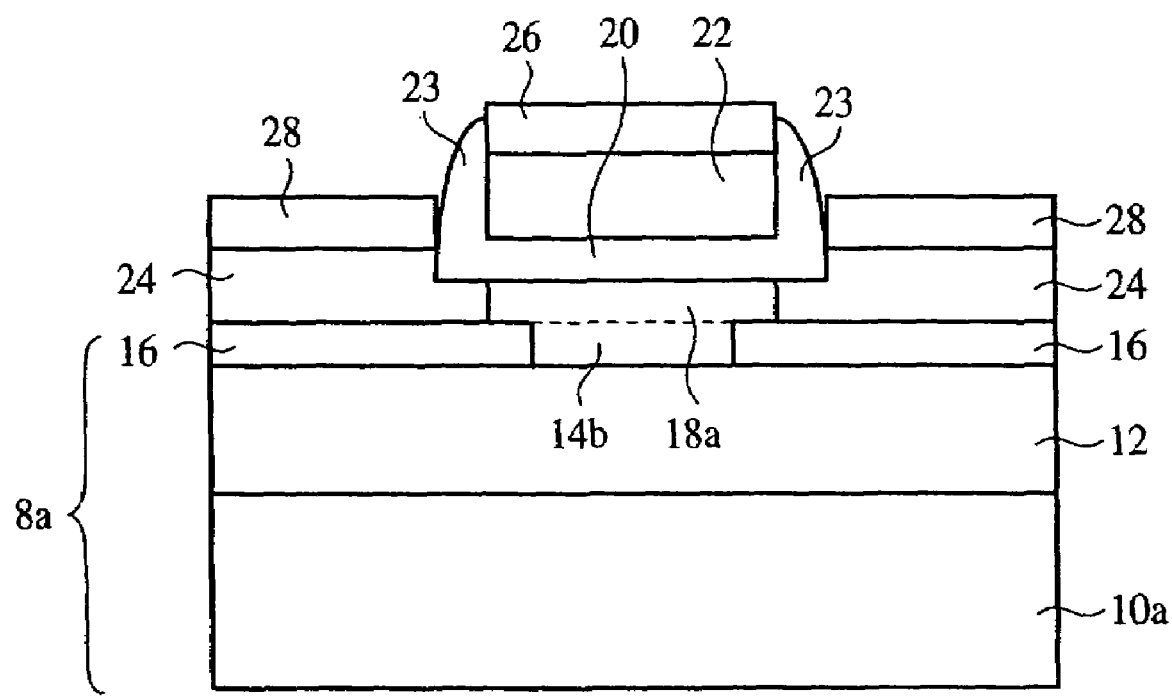
FIG. 12 is a sectional view of the semiconductor device according to Modification 4 of the first embodiment of the present invention.

Then, Modification 4 of the semiconductor device according to the present embodiment will be explained with reference to FIG. 12. FIG. 12 is a sectional view of the semiconductor device according to the present modification.

The semiconductor device according to the present embodiment is characterized mainly in that a semiconductor region 14b of p type SiGe is formed below a semiconductor layer 18a of intrinsic SiGe.

As shown in FIG. 12, the semiconductor region 14b of p type SiGe is formed below the semiconductor layer 18a of intrinsic SiGe. A composition of the semiconductor region is, e.g., $Si_{0.5}Ge_{0.5}$. A composition of the semiconductor region 14b is, e.g., $Si_{0.5}Ge_{0.5}$.

The substrate 10a is the base substrate of an SiGeOI (SiGe On Insulator) substrate 8a. An insulation layer 12 is a buried oxide film of the SiGeOI substrate 8a. The semiconductor region 14b is a SiGe layer formed on the buried oxide film of the SiGeOI substrate 8a. The SiGeOI substrate is a substrate comprising a semiconductor layer of SiGe formed on a buried oxide film formed on a base substrate.

In the semiconductor device according to the present modification, the semiconductor region 14b of p type SiGe is formed below the semiconductor layer 18a of intrinsic SiGe, whereby the carriers can be confined in the semiconductor layer 18a, as can be in the semiconductor device shown in FIG. 1. That is, in the present modification, the carriers can be confined in the region spaced from the surface of the buried oxide film 12.

Thus, the semiconductor device according to the present modification can prevent the surface scattering of carriers and phonon scattering while suppressing the short channel effect, and resultantly, can have high mobility and high speed.

(Modification 5)

Figure 13:
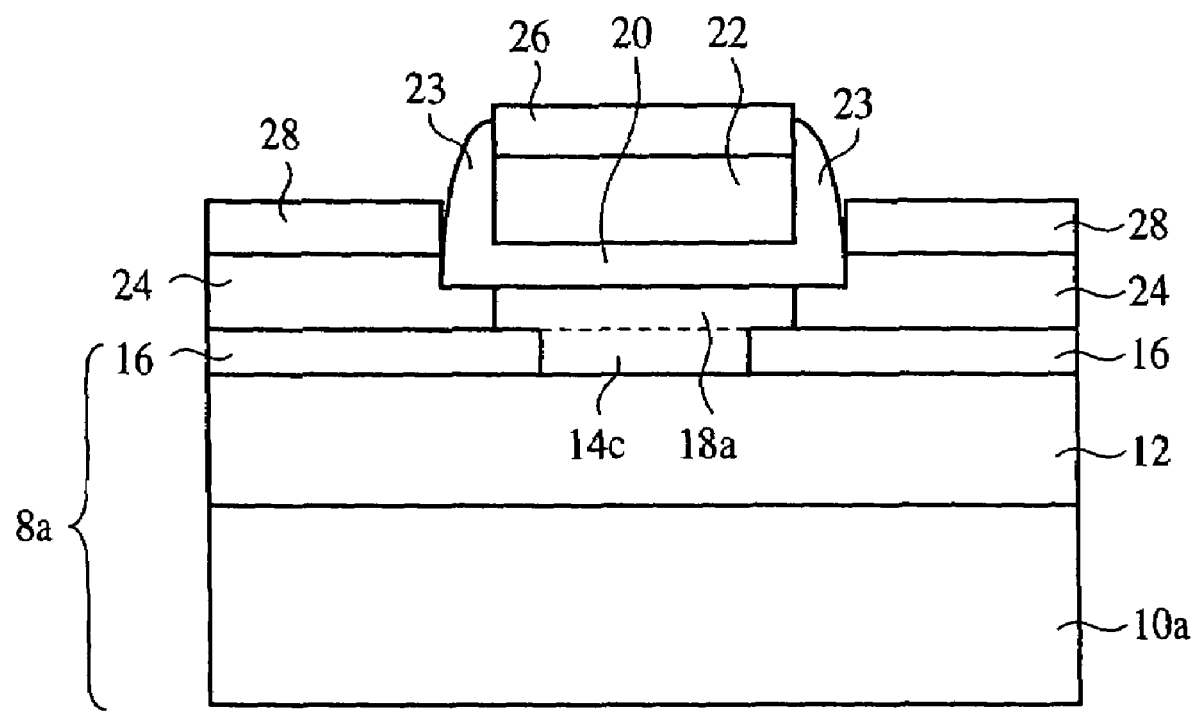
FIG. 13 is a sectional view of the semiconductor device according to Modification 5 of the first embodiment of the present invention.

Next, Modification 5 of the semiconductor device according to the present embodiment will be explained with reference to FIG. 13. FIG. 13 is a sectional view of the semiconductor device according to the present modification.

The semiconductor device according to the present modification is characterized mainly in that a semiconductor region 14c of intrinsic SiGe is formed below a semiconductor layer 18a of intrinsic SiGe.

In the semiconductor device shown in FIG. 12, the semiconductor region 14b of p type SiGe is formed below the semiconductor layer 18a of intrinsic SiGe, whereby the carriers are confined in the semiconductor layer 18a.

Figure 14:
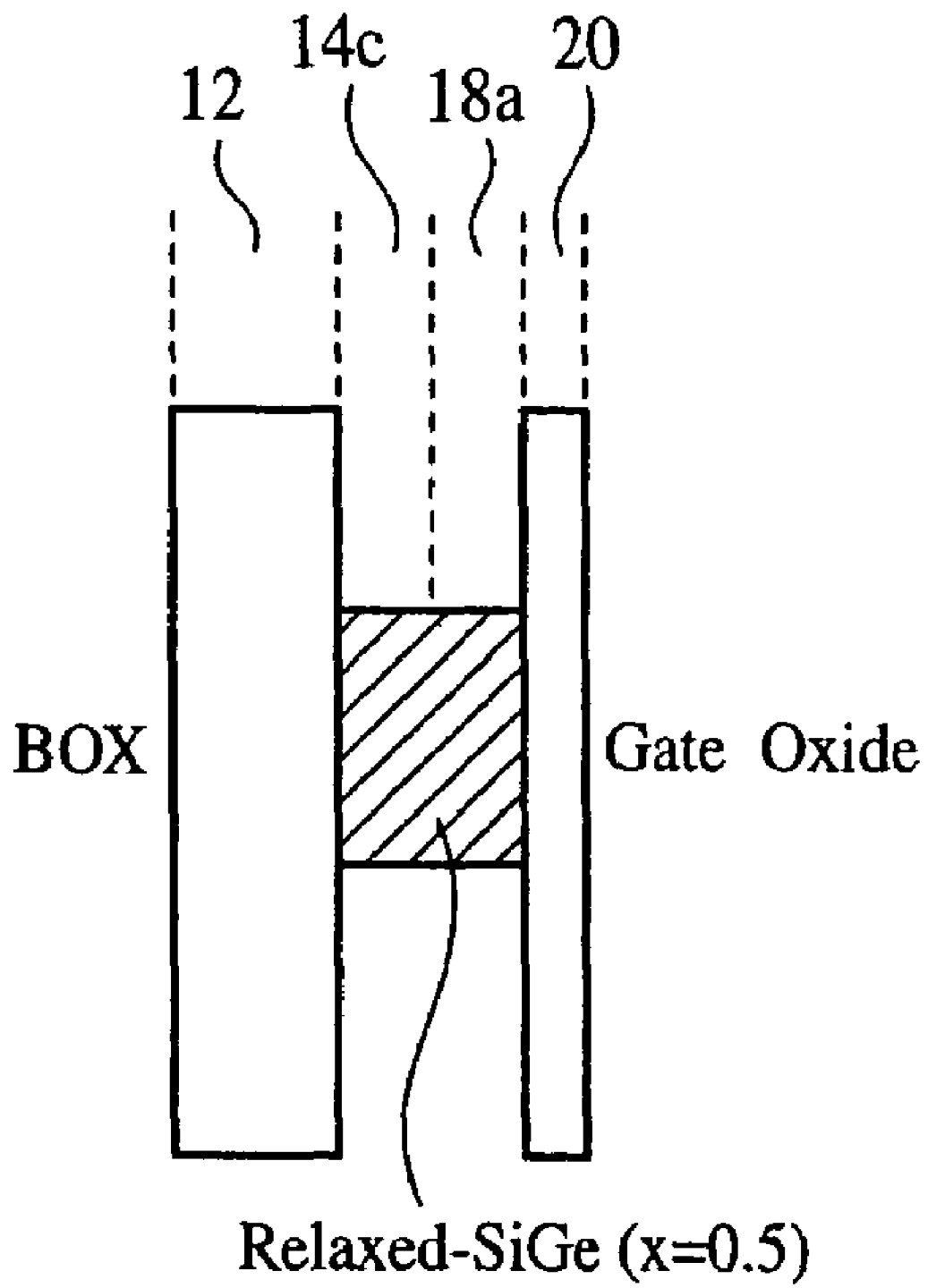
FIG. 14 is a view of an energy band structure of the semiconductor device of Modification 5 of the first embodiment of the present invention.

In the present modification, however, the semiconductor region 14b of intrinsic SiGe is formed below the semiconductor layer 18a of intrinsic SiGe, whereby the energy band structure shown in FIG. 14 is as shown in FIG. 14. FIG. 14 is a view of the energy band structure of the semiconductor device according to the present modification.

As seen in FIG. 14, in the present modification, the carriers cannot be confined by the semiconductor layer 18a alone.

However, as can the semiconductor device shown in FIG. 10, the semiconductor device according to the present modification can prevent the surface scattering of the carriers and the phonon scattering as much as in a semiconductor device having the channel layer of a thick semiconductor layer.

Furthermore, as described above, generally the short channel effect tends to occur in a semiconductor device having the channel layer formed of a thick semiconductor layer. However, in the present modification, because of the insulation layer 16 formed on both sides of the semiconductor region 14b, i.e., below the source/drain region 24, the short channel effect can be suppressed.

Accordingly, the semiconductor device according to the present modification can have high mobility and high speed while suppressing the short channel effect.

A SECOND EMBODIMENT

Figure 15:
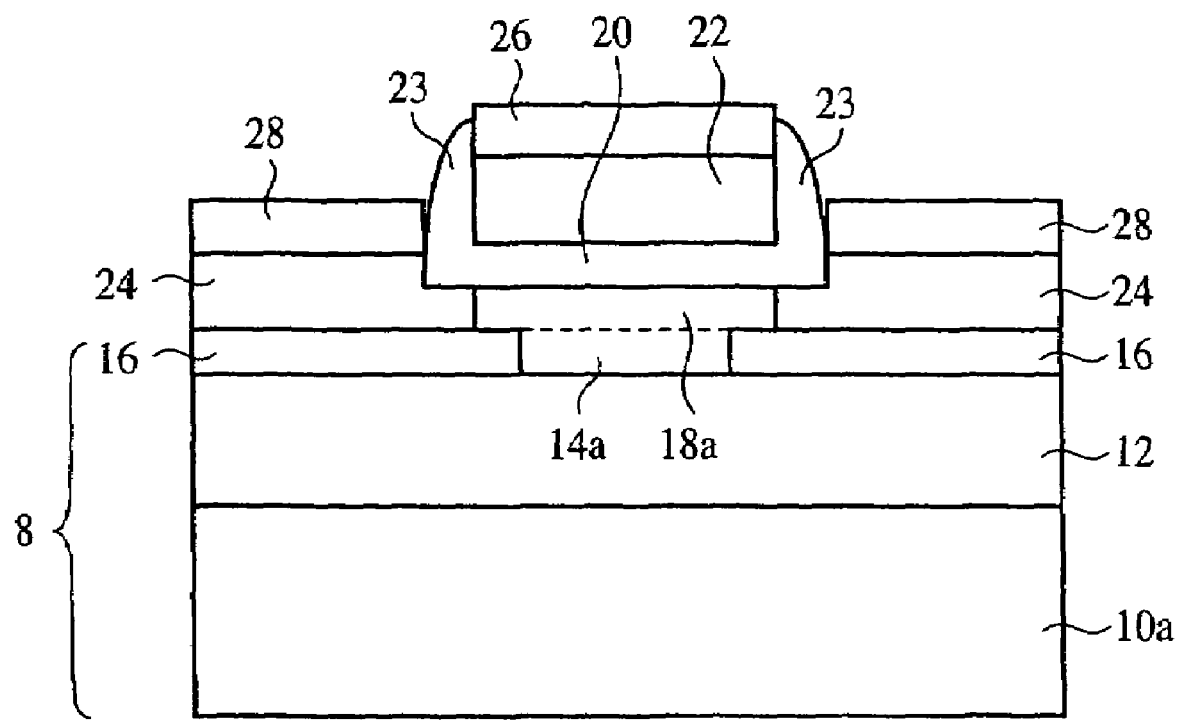
FIG. 15 is a sectional view of the semiconductor device according to a second embodiment of the present invention.

The semiconductor device according to a second embodiment of the present invention will be explained with reference to FIG. 15. FIG. 15 is a sectional view of the semiconductor device according to the present embodiment. The same members of the present embodiment as those of the semiconductor device according to the first embodiment and the method for fabricating the semiconductor device shown in FIGS. 1 to 14 are represented by the same reference numbers not to repeat or to simplify their explanation.

The semiconductor device according to the present modification is characterized mainly in that a semiconductor region 14a of Si is formed below the semiconductor layer 18a of SiGe.

As shown in FIG. 15, the semiconductor layer 18a of 20 nm-thickness SiGe is formed on the semiconductor region 14a of 10 nm-thickness Si. A composition of the semiconductor layer 18a is, e.g., $Si_{0.5}Ge_{0.5}$.

Because of the lattice constant different between SiGe and Si, when the semiconductor layer 18a of SiGe is grown on the semiconductor region 14a of Si, the semiconductor layer 18a of SiGe is strained. Specifically, because the lattice constant of SiGe is larger than that of Si, compression strains are applied to the semiconductor layer 18a of SiGe. When strains are applied to the semiconductor layer 18a of SiGe, a mobility of the electrons and holes is improved.

Thus, the semiconductor device according to the present embodiment can realize further mobility increase.

Figure 16:
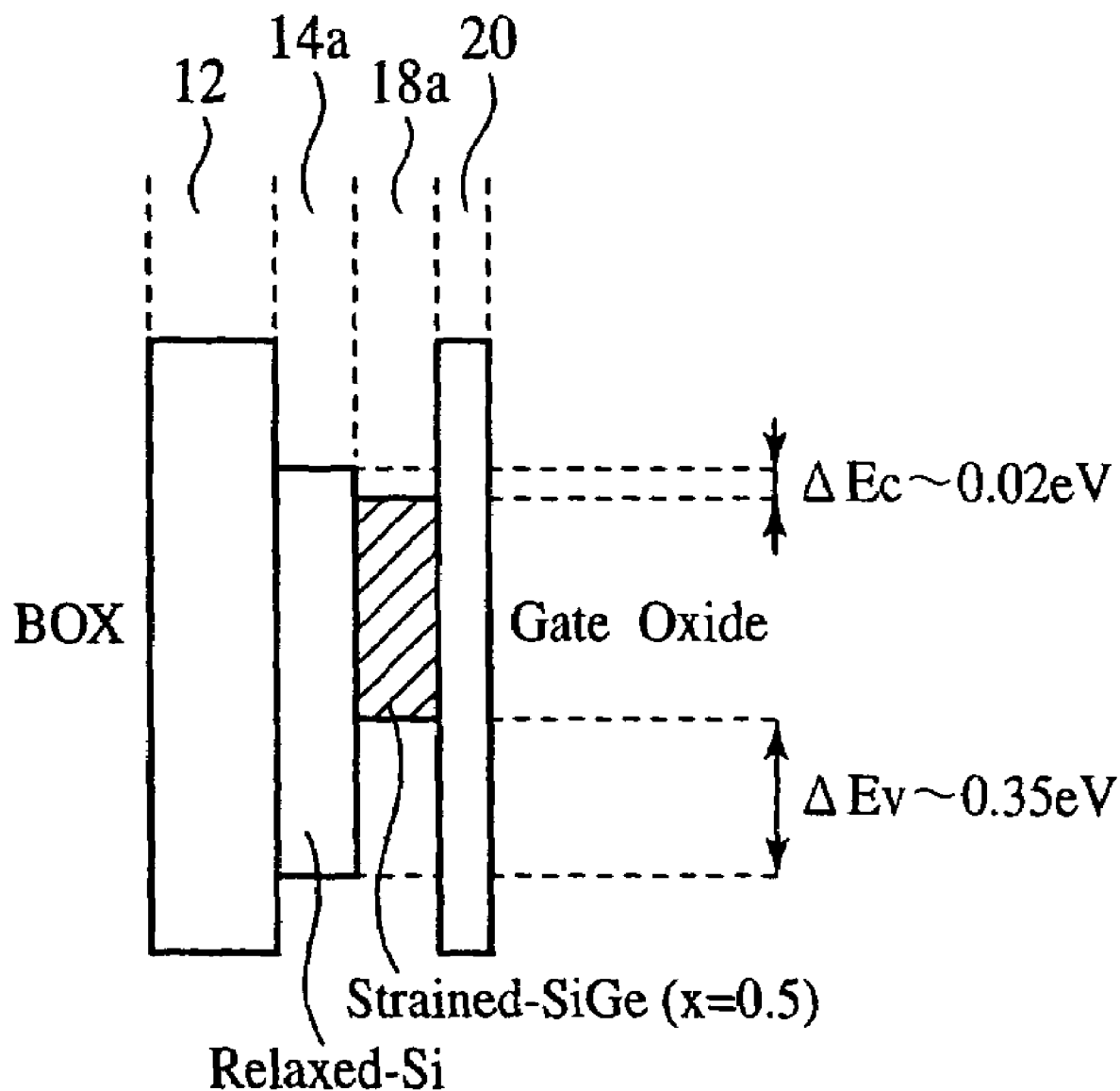
FIG. 16 is a view of an energy band structure of the semiconductor device according to the second embodiment of the present invention.

In the semiconductor device according to the present embodiment, because of the semiconductor region 14a of Si formed below the semiconductor layer 18a of SiGe, the energy band structure is as shown in FIG. 16. FIG. 16 is a view of the energy band structure of the semiconductor device according to the present embodiment.

As seen in FIG. 16, in the present embodiment, a type I quantum well is formed by the semiconductor layer 18a of SiGe. The semiconductor layer 18a of SiGe functions as a quantum well for either of the electrons and holes.

According to the present embodiment, because the semiconductor layer 18a of SiGe functions as a quantum well for either of the electrons and holes, either of a p-channel MOSFET and an n-channel MOSFET can be formed.

As described above, according to the present embodiment, because of the semiconductor layer 18a of SiGe formed on the semiconductor region 14a of Si, strains are applied to the semiconductor layer 18a of SiGe. Thus, the semiconductor device according to the present embodiment can have higher mobility.

The semiconductor layer 18a of SiGe functions as a quantum well for either of the electrons and the holes. Thus, the semiconductor device according to the present embodiment can include either of p-channel MOSFETs and n-channel MOSFETs.

(A Modification)

Figure 17:
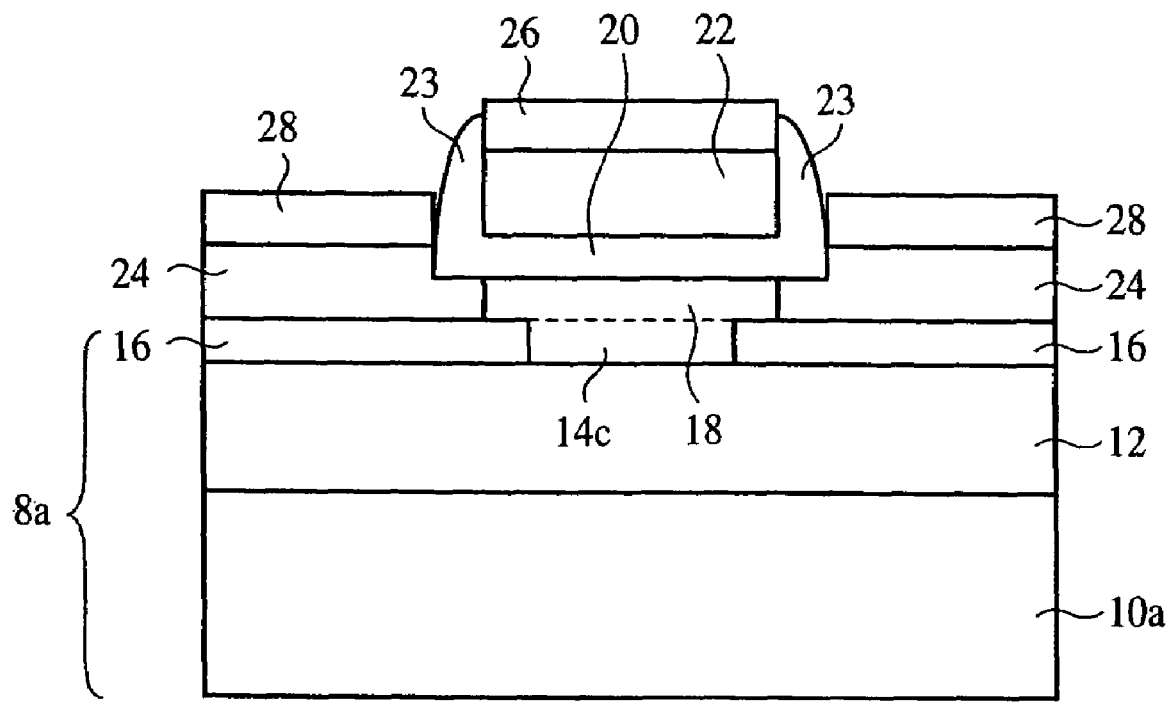
FIG. 17 is a sectional view of a modification of the semiconductor device according to the second embodiment of the present invention.

Next, a modification of the semiconductor device according to the present embodiment will be explained with reference to FIG. 17. FIG. 17 is a sectional view of the semiconductor device according to the present modification.

The semiconductor device according to the present modification is characterized mainly in that a semiconductor region 14c of SiGe is formed below a semiconductor layer 18 of Si.

As shown in FIG. 17, a channel layer 18 of 20 nm-thickness intrinsic Si is formed on the semiconductor region 14c of 10 nm-thickness intrinsic SiGe. A composition of the semiconductor region 14c is, e.g., $Si_{0.5}Ge_{0.5}$.

Si has the lattice constant, which is different from that of SiGe, and when the semiconductor layer 18 of Si grown on the semiconductor region 14c of SiGe, strains are applied to the semiconductor layer 18 of Si. Specifically, because of the lattice constant of Si, which is smaller than that of SiGe, tensile stresses are applied to the semiconductor layer 18 of Si. When such strains are applied to the semiconductor layer 18 of Si, a mobility of the electrons and the holes in the semiconductor layer 18 of Si is increased.

Thus, according to the present modification, further improvement of the mobility can be realized.

Figure 18:
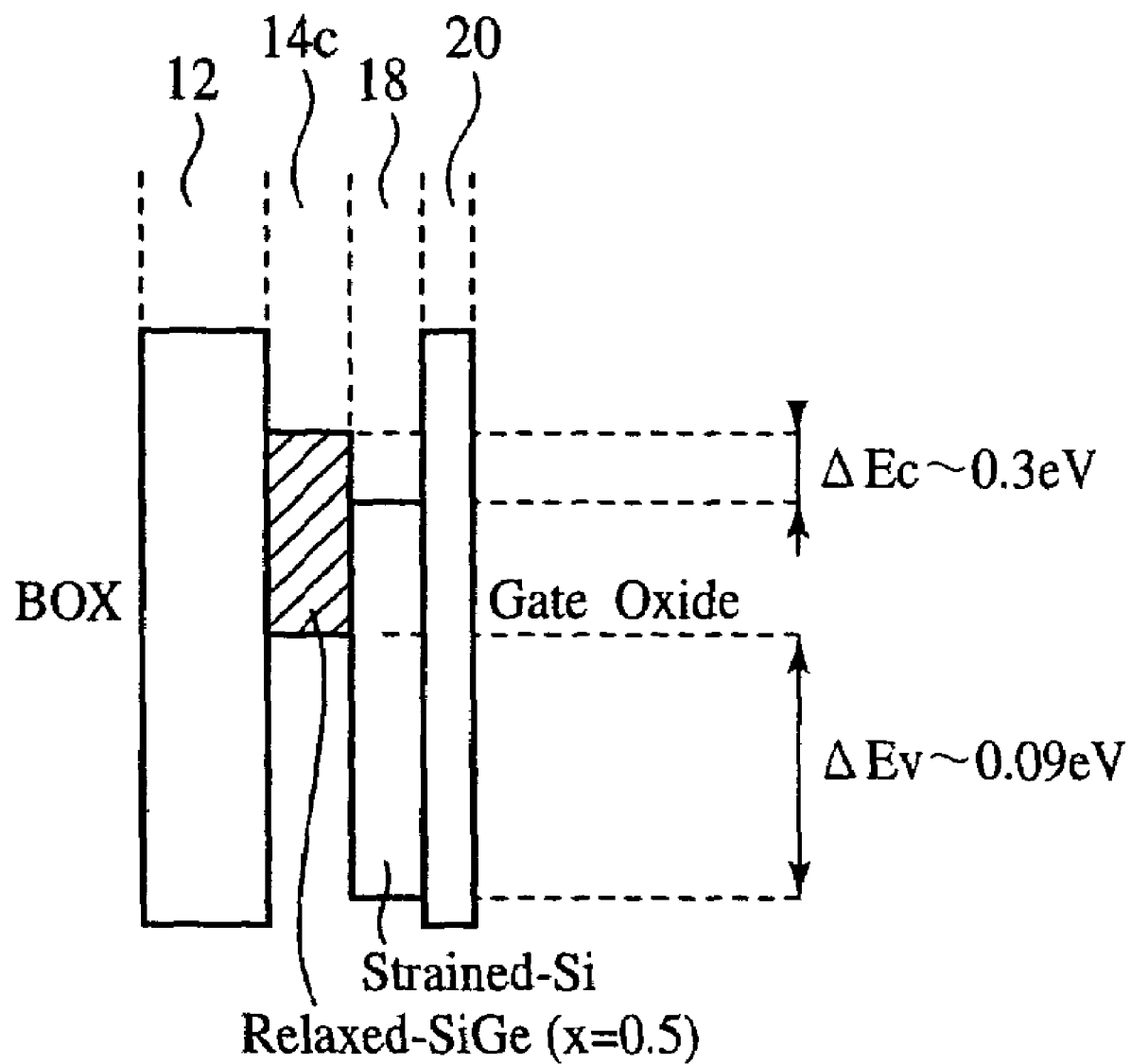
FIG. 18 is a view of an energy band structure of the semiconductor device according to the modification of the second embodiment of the present invention (Part 1).
Figure 19:
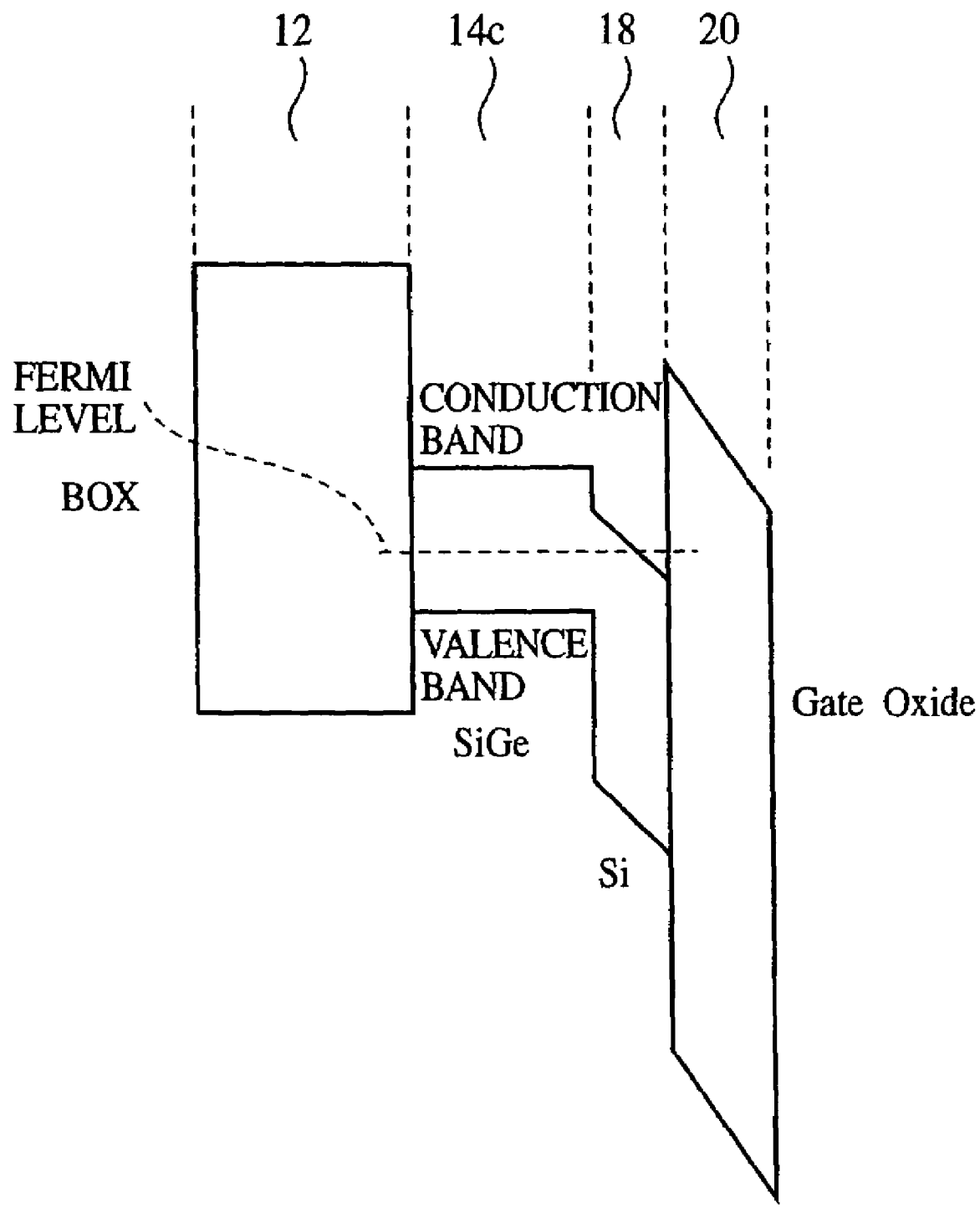
FIG. 19 is a view of an energy band structure of the semiconductor device according to the modification of the second embodiment of the present invention (Part 2).

In the semiconductor device according to the present modification, because of the semiconductor region 14c of SiGe formed below the channel layer 18 of Si, an energy band structure is as shown in FIG. 18. FIG. 18 is a view of the energy band structure of the semiconductor device according to the present modification (Part 1). FIG. 19 is a view of an energy band structure of the semiconductor device according to the present modification (Part 2). FIG. 18 shows the energy band structure given when no voltage is applied to the gate electrode. FIG. 19 shows the energy band structure given when a voltage is applied to the gate electrode.

As seen in FIGS. 18 and 19, in the modification, a type II quantum well is formed by the semiconductor layer 18 of Si. As seen in FIGS. 18 and 19, the energy step is generated between the semiconductor region 14c of SiGe and the semiconductor layer 18 of Si. The energy step functions as a potential barrier to the carriers.

In the present modification, the semiconductor layer 18 of Si functions as a quantum well for the electrons. On the other hand, the semiconductor region 14c of SiGe functions as a quantum well for the holes.

As described above, according to the present modification, because of the semiconductor layer 18 of Si formed on the semiconductor region 14c of SiGe, strains are applied to the semiconductor layer 18 of Si. Thus, the semiconductor device according to the present modification can realize further mobility increase.

A THIRD EMBODIMENT

Figure 20:
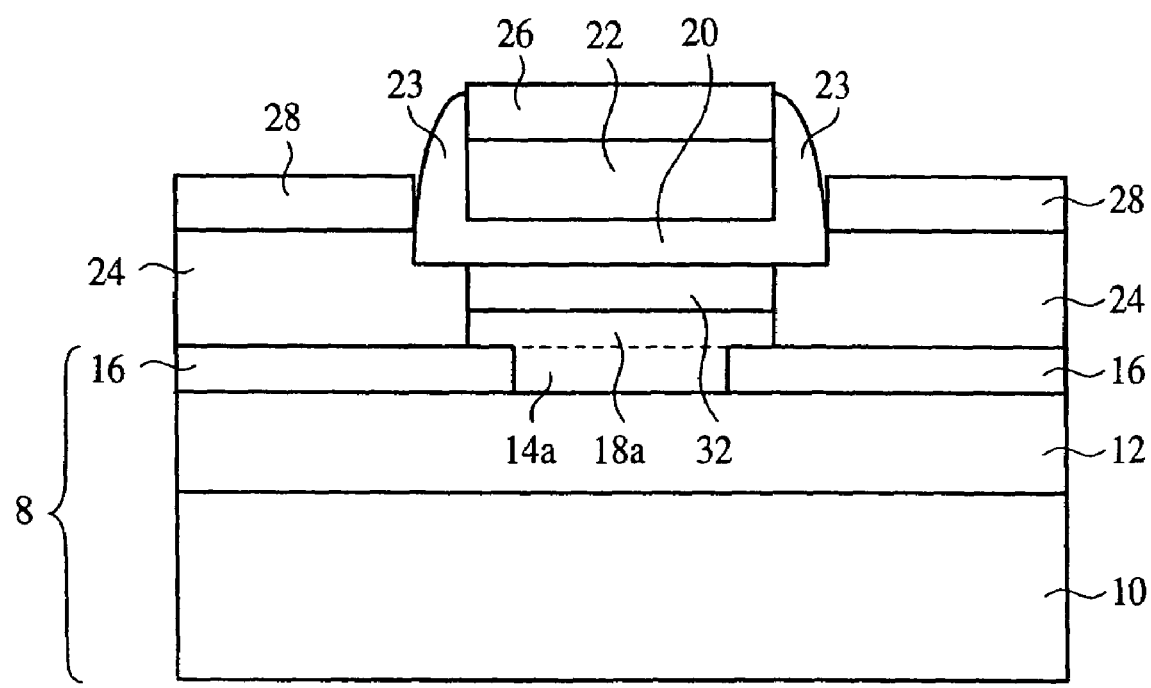
FIG. 20 is a sectional view of the semiconductor device according to a third embodiment of the present invention.

The semiconductor device according to a third embodiment of the present invention and the method for fabricating the semiconductor device will be explained with reference to FIG. 20. FIG. 20 is a sectional view of the semiconductor device according to the present embodiment. The same members of the present embodiment as those of the semiconductor device according to the first embodiment and the method for fabricating the semiconductor device shown in FIGS. 1 to 19 are represented by the same reference numbers not to repeat or to simplify their explanation.

(The Semiconductor Device)

First, the semiconductor device according to the present embodiment will be explained with reference to FIG. 20.

The semiconductor device according to the present embodiment is characterized mainly in that a semiconductor region 14a of Si is formed below a semiconductor layer 18a of SiGe, and a semiconductor layer 32 of Si is further formed on the semiconductor layer 18a of SiGe.

As shown in FIG. 20, the semiconductor layer 18a of 10 nm-thickness intrinsic SiGe is formed on the semiconductor region 14a of 10 nm-thickness intrinsic SiGe. A composition of the semiconductor region 14a is, e.g., $Si_{0.5}Ge_{0.5}$.

The semiconductor layer 32 of intrinsic SiGe is formed on the semiconductor layer 18a of Si. A composition of the semiconductor layer 32 is, e.g., $Si_{0.5}Ge_{0.5}$.

Figure 21:
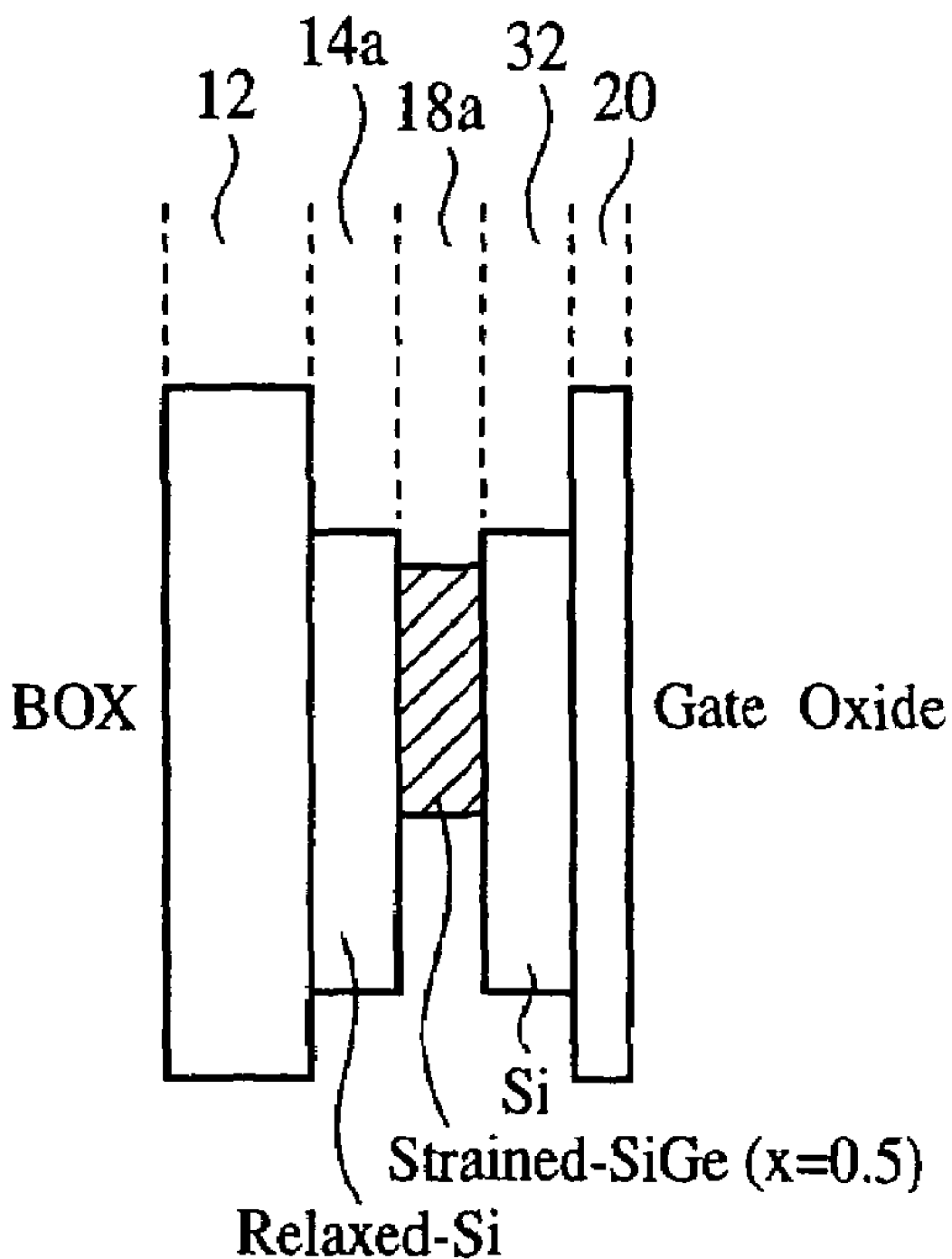
FIG. 21 is a view of an energy band structure of the semiconductor device according to the third embodiment of the present invention.

In the semiconductor device according to the present embodiment, the semiconductor region 14a of Si is formed below the semiconductor layer 18a of SiGe, and the semiconductor layer 32 of Si is formed on the semiconductor layer 18a of SiGe, whereby the energy band structure is as shown in FIG. 21. FIG. 21 is a view of the energy band structure of the semiconductor device according to the present embodiment.

As seen in FIG. 21, in the semiconductor device according to the present embodiment, a type I quantum well is formed by the semiconductor layer 18a of SiGe, and the carriers are confined in the semiconductor layer 18a of SiGe.

In the present embodiment, a p-channel is formed in the semiconductor 18a of SiGe. On the other hand, an n-channel is formed in the semiconductor layer 32 of Si.

The semiconductor device according to the present embodiment can form a p-channel in the semiconductor layer 18a, and an n-channel in the semiconductor layer 32 and is called a heterochannel CBMOSFET (Channel Barrier MOSFET).

Furthermore, in the semiconductor device according to the present embodiment, the semiconductor layer 32 of Si is formed between the semiconductor layer 18a of SiGe and a gate insulation film 20, whereby the carriers can be confined in a region paced from the interface with the gate insulation film 20.

In the semiconductor device according to the first and the second embodiments, the carriers can be confined in a region spaced from the buried oxide film 12 but cannot confine the carriers in the region spaced form the interface with the gate insulation film 20. Accordingly, in the semiconductor device according to the first and the second embodiments, the scattering of the carriers in the interface with the gate insulation film 20 cannot be prevented.

In contrast to this, according to the present embodiment, the semiconductor layer 32 of Si is formed between the semiconductor layer 18a of SiGe and the gate insulation film 20, whereby the carriers can be confined in the region spaced from the interface with the gate insulation film 20. Thus, according to the present embodiment, the scattering of the carriers in the interface with the gate insulation film 20 can be prevented. Thus, the semiconductor device according to the present embodiment can have higher mobility and higher speed.

(The Method for Fabricating the Semiconductor Device)

Then, the method for fabricating the semiconductor device according to the present embodiment will be explained with reference to FIGS. 22A to 23C. FIGS. 22A to 23C are sectional views of the semiconductor device according to the present embodiment in the steps of the method for fabricating the semiconductor device, which explain the method.

The steps up to the step of removing a hardmask 30 including the hard mask removing step are the same as those of the method for fabricating the semiconductor device described above with reference to FIGS. 3A to 3D, and their explanation is not repeated.

Then, as shown in FIG. 22A, a Ge (germanium)-content amorphous silicon film 17a of, e.g., 10 nm-thickness is formed on the entire surface by, e.g., CVD. A raw material gas is used, e.g., a mixed gas of $GeH_4$ and $Si_2H_6$, a mixed gas of $GeH_4$ and $SiH_4$ or a mixed gas of $GeH_4$ and $SiH_2Cl_2$. A film forming temperature is, e.g., about 300° C.

Then, an amorphous silicon film 17b of, e.g., a 10 nm-thickness is formed on the entire surface by, e.g., CVD. A raw material gas is, e.g., $SiH_4$. A film forming temperature is, e.g., about 400° C.

Then, as shown in FIG. 22B, the Ge-content amorphous silicon film 17a and the amorphous silicon film 17b are single crystallized by, e.g., solid phase epitaxial (SPE) growth. Thermal processing conditions are, e.g., 550° C. and 12 hours. Thus, the single crystal grows by, e.g., 0.2-0.3 µm to both sides from the middle of the semiconductor region 14. Since a gate length is, e.g., about 0.1 µm, such single crystal growth is sufficient. Thus, the semiconductor layers 18a, 32 are single crystallized.

The following semiconductor fabrication steps shown in FIGS. 22C to 23C are the same as those of the semiconductor fabrication method described above with reference to FIGS. 4C to 5C, and their explanation will not be repeated.

Thus the semiconductor device according to the present embodiment is fabricated.

(Modification 1)

Figure 24:
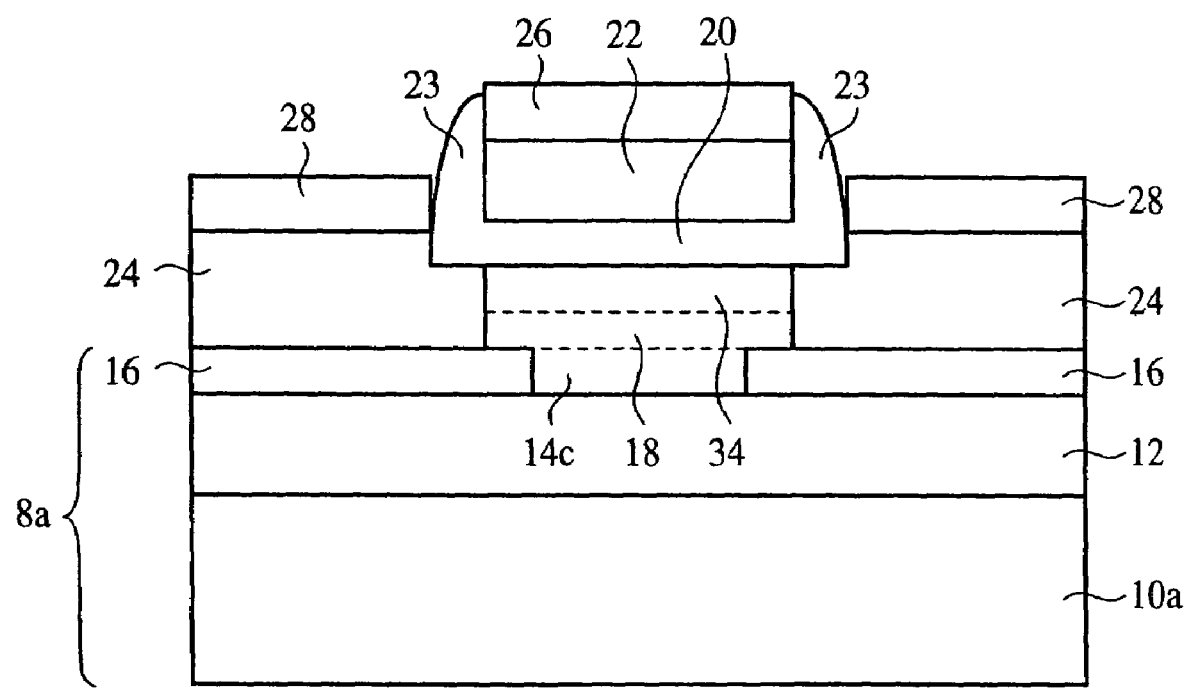
FIG. 24 is a sectional view of the semiconductor device according to Modification 1 of the third embodiment of the present invention.

Next, Modification 1 of the semiconductor device according to the present embodiment will be explained with reference to FIG. 24. FIG. 24 is a sectional view of the semiconductor device according to the present modification.

The semiconductor device according to the present modification is characterized mainly in that a semiconductor region 14c of SiGe is formed below a semiconductor layer 18 of Si, and a semiconductor layer 34 of SiGe is formed on the semiconductor layer 18 of Si.

As shown in FIG. 24, the semiconductor layer 18 of intrinsic Si is formed on the semiconductor region 14c of intrinsic SiGe. A composition of the SiGe forming the semiconductor region 14c is, e.g., $Si_{0.5}Ge_{0.5}$. The semiconductor region 14c of SiGe is an SiGe layer formed on a buried oxide film of an SiGeOI substrate 8a.

The semiconductor layer 34 of SiGe is formed on the semiconductor layer 18 of Si. A composition of the semiconductor layer 34 is, e.g., $Si_{0.5}Ge_{0.5}$.

Figure 25:
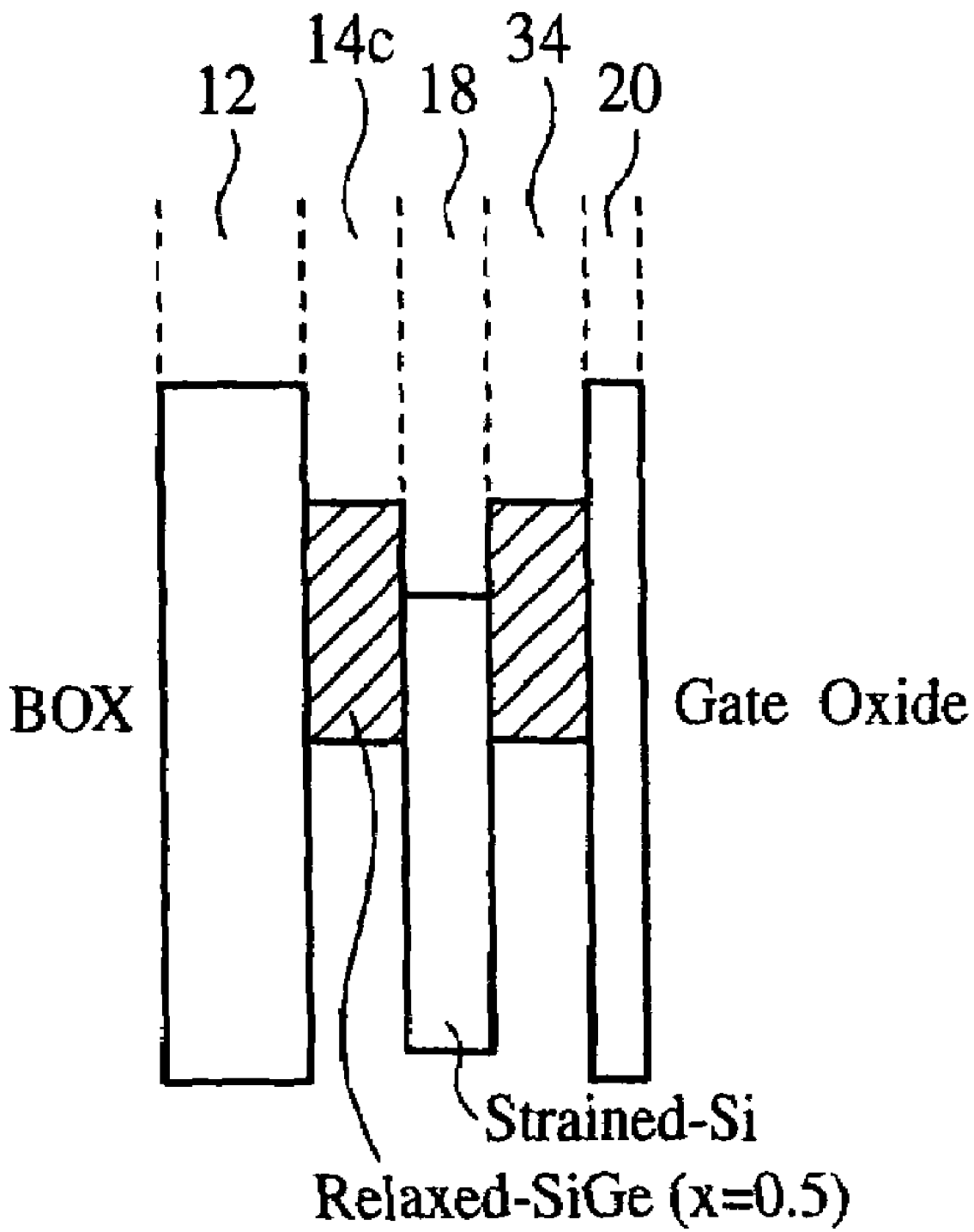
FIG. 25 is a view of an energy band structure of the semiconductor device according to Modification 1 of the third embodiment of the present invention.

In the semiconductor device according to the present modification, because the semiconductor region 14c of SiGe is formed below the semiconductor layer 18 of Si, and the semiconductor layer 34 of SiGe is formed on the semiconductor layer 18 of Si, the energy band structure is as shown in FIG. 25. FIG. 25 is a view of the energy band structure of the semiconductor device according to the present modification.

As seen in FIG. 25, in the semiconductor device according to the present modification, a type II quantum well is formed by the semiconductor layer 18 of Si.

The semiconductor layer 18 of Si functions as a quantum well for the electrons. On the other hand, the semiconductor layer 34 of SiGe functions as a quantum well for the holes.

In the present modification, because of the semiconductor layer 34 of SiGe formed between the semiconductor layer 18 of Si and the gate insulation film 20, the carriers can be confined in the regin spaced form the interface with the gate insulation film 20.

Thus, it is possible that the semiconductor region 14c of SiGe is formed below the semiconductor layer 18 of Si, and the semiconductor layer 34 of SiGe is formed on the semiconductor layer 18 of Si.

(Modification 2)

Figure 26:
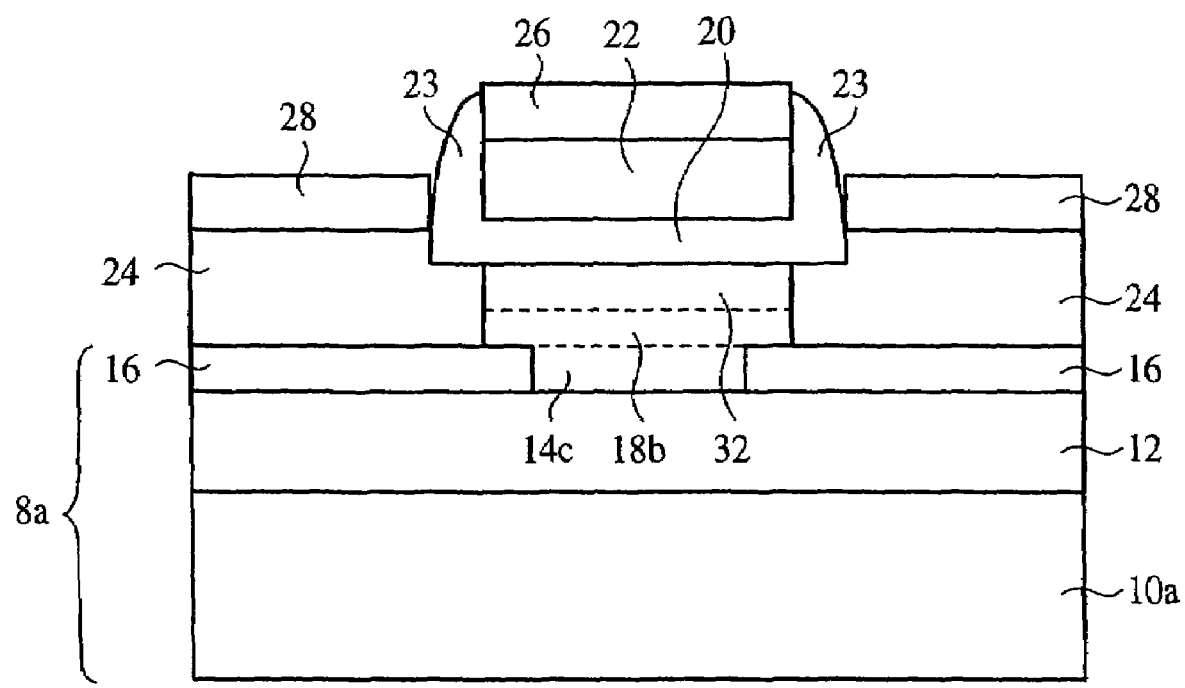
FIG. 26 is a sectional view of the semiconductor device according to Modification 2 of the third embodiment of the present invention.
Figure 27:
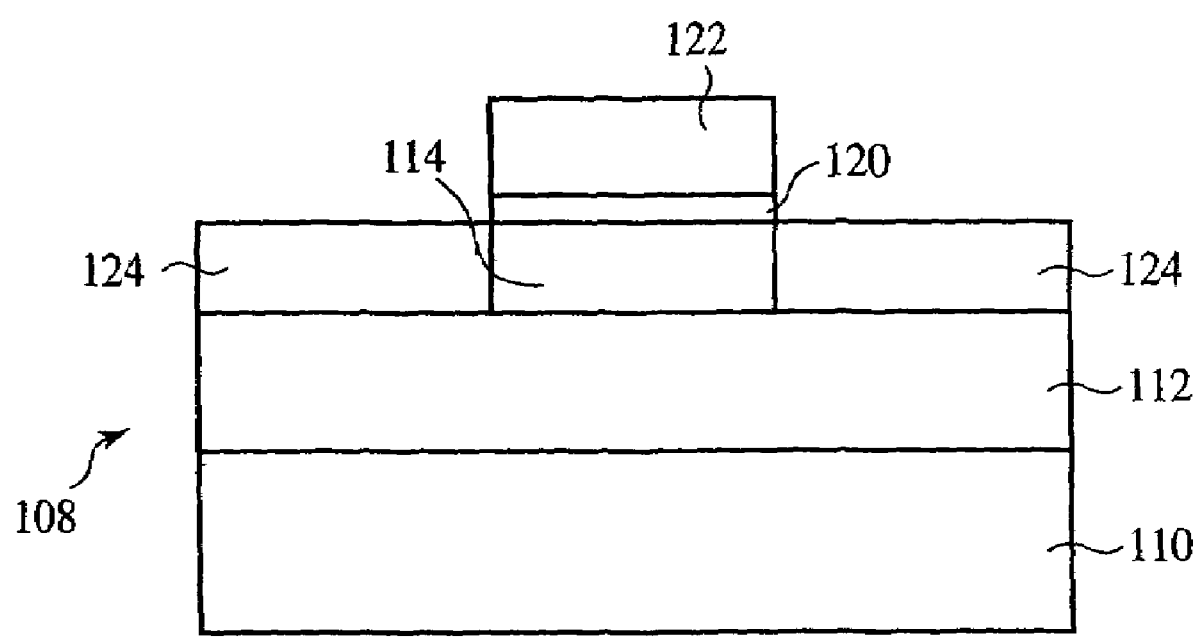
FIG. 27 is a sectional view of the proposed semiconductor device.

Next, Modification 2 of the semiconductor device according to the present embodiment will be explained with reference to FIG. 26. FIG. 26 is a sectional view of the semiconductor device according to the present modification.

The semiconductor device according to the present modification is characterized mainly in that a semiconductor layer 18b of SiGe is formed on a semiconductor region 14c of SiGe with a Ge concentration of the semiconductor layer 18b higher than that of the semiconductor region 14c, and a semiconductor layer 32 of Si is formed on the semiconductor layer 18b.

As shown in FIG. 26. in the semiconductor device according to the present modification, the semiconductor layer 18b of intrinsic SiGe is formed on the semiconductor region 14c of intrinsic SiGe. A composition of the semiconductor region 14c is, e.g., $Si_{0.5}Ge_{0.5}$. A composition of the semiconductor layer 18b is, e.g., $Si_{0.3}Ge_{0.7}$. That is, in the present modification, a Ge composition ratio of the semiconductor layer 18b is larger than that of the semiconductor region 14c.

In the present modification, because the Ge composition ratio of the semiconductor layer 18b is set larger than that of the semiconductor region 14c, the lattice constant of the semiconductor layer 18b is larger than that of the semiconductor region 14c, whereby compression strains can be generated in the semiconductor layer 18b.

According to the present modification, because of compression strains generated in the semiconductor layer 18b, the semiconductor device can realize further higher mobility.

MODIFIED EMBODIMENTS

The present invention is not limited to the above-described embodiments and can cover other various modification.

For example, in the above-described embodiments, n-channel MOSFETs have been exemplified, but the present invention is applicable to the fabrication of p-channel MOSFETs.

In the semiconductor device according to the first embodiment, the semiconductor layer 18 is formed of intrinsic Si, but an n type dopant or a p type dopant maybe suitably implanted in the semiconductor layer 18. That is, unless the carrier mobility is extremely decreased, an n type dopant and a p type dopant may be implanted in the semiconductor layer 18.

In the above-described embodiments, a Ge composition ratio X of the semiconductor layer of $Si_{1-x}Ge_x$ is, e.g., 0.5, but the composition ratio is not limited to 0.5. A Ge composition ratio X can be suitably set in a range of $0<X\leq 1$. Accordingly, semiconductor layers of Ge may be suitably formed.

Conduction types of the respective layers are not limited to those of the above-described embodiments and can be suitably set.

In the semiconductor device according to Modifications 3 to 5 of the first embodiment, and the semiconductor device according to the second and the third embodiments, the source/drain region 24 is formed of a metal silicide but may be formed of a metal. It is possible to implant dopant ions in the semiconductor layer on both sides of the gate electrode to thereby form the source/drain diffused layer.

What is claimed is:

1. A method for fabricating a semiconductor device comprising the steps of:

forming a mask on a first semiconductor layer formed over a substrate;

oxidizing the first semiconductor layer on both sides of the mask to thereby form the first semiconductor layer outside the mask into an insulation layer;

forming a second semiconductor layer on the first semiconductor layer and the insulation layer;

forming a gate insulation film over the second semiconductor layer;

forming a gate electrode over the gate insulation film; and forming a source/drain region in the second semiconductor layer on both sides of the gate electrode, wherein the first semiconductor layer is formed of Si, and the second semiconductor layer is formed of $Si_{1-x}Ge_x$ where a composition ratio X is $0<X\leq 1$.

2. A method for fabricating a semiconductor device according to claim 1, wherein in the step of forming the source/drain region, a metal is buried in the second semiconductor layer on both sides of the gate electrode to thereby form the source/drain region of the metal.

3. A method for fabricating a semiconductor device according to claim 1, wherein in the step of forming the source/drain region, the source/drain region is formed of a metal silicide.

4. A method for fabricating a semiconductor device according to claim 1, further comprising the step of forming a third semiconductor layer on the second semiconductor layer after the step of forming the second semiconductor layer and before the step of forming the gate insulation film.

5. A method for fabricating a semiconductor device according to claim 4, wherein the third semiconductor layer is formed of Si.

* * * * *